United States Patent
Jeong et al.

(10) Patent No.: US 9,484,526 B2
(45) Date of Patent: Nov. 1, 2016

(54) MAGNETIC MEMORY DEVICE AND METHOD FOR FORMING THE SAME

(71) Applicants: Dae-Eun Jeong, Yongin-si (KR); Sang-Yong Kim, Suwon-si (KR); Yoon-Jong Song, Hwaseong-si (KR)

(72) Inventors: Dae-Eun Jeong, Yongin-si (KR); Sang-Yong Kim, Suwon-si (KR); Yoon-Jong Song, Hwaseong-si (KR)

(73) Assignee: SAMSUNG ELECTRONICS CO., LTD. (KR)

(*) Notice: Subject to any disclaimer, the term of this patent is extended or adjusted under 35 U.S.C. 154(b) by 0 days.

(21) Appl. No.: 14/656,659

(22) Filed: Mar. 12, 2015

(65) Prior Publication Data

US 2016/0020384 A1 Jan. 21, 2016

(30) Foreign Application Priority Data

Jul. 18, 2014 (KR) .......................... 10-2014-0091113

(51) Int. Cl.
*H01L 43/08* (2006.01)
*H01L 43/02* (2006.01)
*G11C 11/16* (2006.01)
*G11C 13/00* (2006.01)

(52) U.S. Cl.
CPC ............ *H01L 43/08* (2013.01); *G11C 11/161* (2013.01); *G11C 11/1675* (2013.01); *H01L 43/02* (2013.01); *G11C 2013/0083* (2013.01)

(58) Field of Classification Search
CPC ..... H01L 43/08; H01L 43/02; G11C 11/161; G11C 11/1675
See application file for complete search history.

(56) References Cited

U.S. PATENT DOCUMENTS

| | | | |
|---|---|---|---|
| 6,784,509 B2* | 8/2004 | Kamiguchi | B82Y 10/00 257/421 |
| 8,213,130 B1* | 7/2012 | Fuji | B82Y 10/00 360/324 |
| 8,374,025 B1* | 2/2013 | Ranjan | B82Y 10/00 365/148 |
| 8,379,351 B2* | 2/2013 | Fuji | B82Y 10/00 360/324.1 |
| 8,383,427 B2 | 2/2013 | Matsuda et al. | |
| 8,564,080 B2* | 10/2013 | Chen | H01L 43/08 257/421 |
| 9,070,855 B2* | 6/2015 | Gan | H01L 43/02 |
| 2006/0180839 A1* | 8/2006 | Fukumoto | B82Y 25/00 257/295 |
| 2011/0031569 A1 | 2/2011 | Watts et al. | |
| 2011/0108937 A1 | 5/2011 | Reid | |
| 2011/0235217 A1 | 9/2011 | Chen et al. | |
| 2013/0236744 A1* | 9/2013 | Brinkman | G11B 5/3906 428/811.2 |
| 2015/0162378 A1* | 6/2015 | Carey | H01L 43/02 257/421 |
| 2015/0249202 A1* | 9/2015 | Siddik | H01L 43/02 257/421 |

FOREIGN PATENT DOCUMENTS

KR 101074203 A 10/2011

\* cited by examiner

*Primary Examiner* — William Coleman
(74) *Attorney, Agent, or Firm* — Renaissance IP Law Group LLP

(57) ABSTRACT

Provided are a magnetic memory device and a method of forming the same. The magnetic memory device includes a magnetic tunnel junction pattern located on a substrate and including magnetic patterns and a tunnel barrier pattern located between the magnetic patterns, and a first crystallinity conserving pattern located on the magnetic tunnel junction pattern and having a higher crystallization temperature than the magnetic patterns. The first crystallinity conserving pattern is amorphous.

13 Claims, 23 Drawing Sheets

MAGNETIC MEMORY DEVICE AND METHOD FOR FORMING THE SAME

CROSS-REFERENCE TO RELATED APPLICATION

This application claims priority under 35 U.S.C. §119 to Korean Patent Application No. 10-2014-0091113 filed on Jul. 18, 2014, the disclosure of which is hereby incorporated by reference in its entirety.

BACKGROUND

Field

Embodiments of the inventive concepts relate to a magnetic memory device including a magnetic tunnel junction pattern and a method of forming the same.

Description of Related Art

A magnetic memory device includes a magnetic tunnel junction pattern. A lower magnetic pattern, a tunnel barrier pattern, and an upper magnetic pattern included in the magnetic tunnel junction pattern may be stacked in a vertical direction. Various studies for improving an electromagnetic characteristic of the magnetic tunnel junction pattern in the magnetic memory device are now being conducted.

SUMMARY

Embodiments of the inventive concepts provide a magnetic memory device, in which an electromagnetic characteristic of a magnetic tunnel junction pattern is improved, and a method of forming the same.

Other embodiments of the inventive concepts provide a magnetic memory device, in which crystal orientations of magnetic patterns of a magnetic tunnel junction pattern are determined without being affected by components adjacent to the magnetic tunnel junction pattern, and a method of forming the same.

Other embodiments of the inventive concepts provide a magnetic memory device, in which damage of a magnetic pattern is prevented from a forming of a magnetic tunnel junction pattern, and a method of forming the same.

The technical objectives of the inventive concepts are not limited to the above disclosure; other objectives may become apparent to those of ordinary skill in the art based on the following descriptions.

In accordance with an aspect of the inventive concepts, a magnetic memory device includes a magnetic tunnel junction pattern located on a substrate and including magnetic patterns and a tunnel barrier pattern located between the magnetic patterns, and a first crystallinity conserving pattern located on the magnetic tunnel junction pattern and having a crystallization temperature higher than that of the magnetic patterns. The first crystallinity conserving pattern is substantially amorphous.

A side surface of the first crystallinity conserving pattern may be vertically aligned with a side surface of the magnetic tunnel junction pattern.

The magnetic memory device may further include an upper electrode located on the first crystallinity conserving pattern, wherein a side surface of the upper electrode may be vertically aligned with the side surface of the first crystallinity conserving pattern.

The first crystallinity conserving pattern may directly contact the magnetic tunnel junction pattern.

The magnetic memory device may further include a second crystallinity conserving pattern located on the first crystallinity conserving pattern and having a crystallization temperature different from that of the first crystallinity conserving pattern. The second crystallinity conserving pattern may be substantially amorphous.

A side surface of the second crystallinity conserving pattern may be vertically aligned with the side surface of the first crystallinity conserving pattern.

The second crystallinity conserving pattern may include all materials contained in the first crystallinity conserving pattern. A component ratio of the materials in the second crystallinity conserving pattern may be different from that of the first crystallinity conserving pattern.

In accordance with an aspect of the inventive concepts, a magnetic memory device may include a first magnetic pattern located on a substrate, a tunnel barrier pattern located on the first magnetic pattern and having a crystal orientation that is substantially the same as that of the first magnetic pattern, a second magnetic pattern located on the tunnel barrier pattern and having a crystal orientation that is substantially the same as that of the tunnel barrier pattern, and an amorphous upper crystallinity conserving pattern located on the second magnetic pattern. The upper crystallinity conserving pattern may have a crystallization temperature higher than that of the first magnetic pattern and the second magnetic pattern.

The magnetic memory device may further include a capping pattern located between the second magnetic pattern and the upper crystallinity conserving pattern, and an amorphous intermediate crystallinity conserving pattern located between the second magnetic pattern and the capping pattern. The intermediate crystallinity conserving pattern may have a crystallization temperature higher than that of the first magnetic pattern and the second magnetic pattern.

The magnetic memory device may further include a seed pattern located between the substrate and the first magnetic pattern, a third magnetic pattern located between the seed pattern and the first magnetic pattern and having a crystal orientation that is substantially the same as that of the seed pattern, a spacer pattern located between the third magnetic pattern and the first magnetic pattern, and an interlayer crystallinity conserving pattern located between the spacer pattern and the first magnetic pattern. The interlayer crystallinity conserving pattern may have a crystallization temperature higher than that of the first magnetic pattern and the second magnetic pattern.

A thickness of the interlayer crystallinity conserving pattern may be less than that of the spacer pattern.

In accordance with an embodiment of the inventive concepts, a method of forming a magnetic memory device may include forming a magnetic tunnel junction layer including magnetic layers and a tunnel barrier layer located between the magnetic layers on a substrate, forming an upper crystallinity conserving layer having a crystallization temperature higher than that of the magnetic layers on the magnetic tunnel junction layer, forming an upper electrode layer on the upper crystallinity conserving layer, and crystallizing the magnetic layers located between the substrate and the upper electrode layer at a temperature lower than the crystallization temperature of the upper crystallinity conserving layer.

The formation of the upper crystallinity conserving layer may include forming a preliminary upper crystallinity conserving layer which does not include a first material of materials contained in the upper crystallinity conserving layer on the magnetic tunnel junction layer, and performing ion implantation of the first material into the preliminary upper crystallinity conserving layer.

The upper crystallinity conserving layer may include at least one of Fe, Co, Ni, Mn, V, Cr, Zr, Hf, Si, Mg, Al, Ga, Mo, Ti, Ru, Ta, W or Cu, at least one of B, N, P, As, Sb or Bi, and at least one of Zr, Hf, Si, Mo, Ta or Cu. The first material may include at least one of B, N, P, As, Sb or Bi.

The method of forming the magnetic memory device may further include, before forming a first magnetic layer, forming a lower plug on the substrate, and forming an amorphous lower crystallinity conserving layer on the lower plug. The crystallization of the magnetic layers may be performed at a temperature lower than a crystallization temperature of the lower crystallinity conserving layer.

In accordance with an embodiment of the inventive concepts, a method of forming a magnetic memory device may include forming an amorphous lower magnetic layer on a substrate, forming a crystalline tunnel barrier layer on the lower magnetic layer, forming an amorphous first upper magnetic layer on the tunnel bather layer, forming an amorphous upper crystallinity conserving layer on the first upper magnetic layer, forming an upper electrode layer on the upper crystallinity conserving layer, performing an annealing process on the substrate including the upper electrode layer at a lower process temperature than a crystallization temperature of the upper crystallinity conserving layer, and crystallizing the lower magnetic layer and the first upper magnetic layer, forming a mask pattern on the upper electrode layer, and sequentially patterning the upper electrode layer, the upper crystallinity conserving layer, the first upper magnetic layer, the tunnel barrier layer, and the lower magnetic layer using the mask pattern.

The method of forming the magnetic memory device may further include, before forming the upper crystallinity conserving layer, forming an amorphous interlayer crystallinity conserving layer on the first upper magnetic layer, forming a spacer layer on the interlayer crystallinity conserving layer, and forming a crystalline second upper magnetic layer on the spacer layer. A process temperature in the annealing process may be lower than a crystallization temperature of the interlayer crystallinity conserving layer.

An orientation of the second upper magnetic layer may be different from that of the tunnel barrier layer.

Materials contained in the interlayer crystallinity conserving layer may be substantially the same as materials contained in the upper crystallinity conserving layer.

The method of forming the magnetic memory device may further include, before forming the upper crystallinity conserving layer, forming a crystalline first capping layer on the first upper magnetic layer and forming a crystalline second capping layer on the first capping layer. An orientation of the second capping layer may be different from that of the first capping layer.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
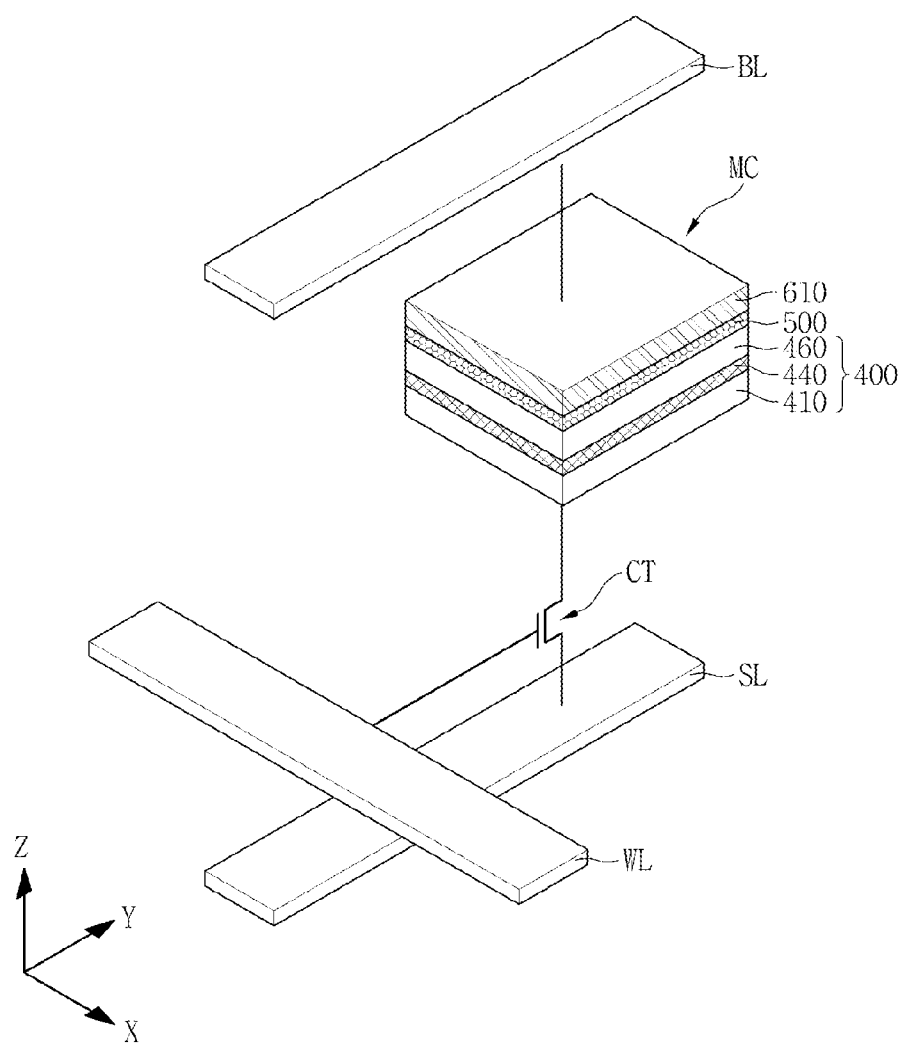
FIG. 1 is a schematic view showing a magnetic memory device in accordance with an embodiment of the inventive concepts.

Purposes, technical configurations, and operational effects of the inventive concepts will be more clearly described in detail with reference to the accompanying drawings which illustrate embodiments of the inventive concepts. The embodiments of the inventive concepts are provided in order to fully convey the technological scope of the inventive concepts to those skilled in the art. Therefore, these inventive concepts may, however, be embodied in different forms and should not be construed as limited to the embodiments set forth herein.

Throughout this specification, like numerals refer to like elements. In the drawings, the lengths and thicknesses of layers and regions may be exaggerated for clarity. In addition, it will be understood that when a first element is referred to as being "on" a second element, the first element may be directly on the second element, or a third element may be interposed between the first element and the second element.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the inventive concepts.

The terminology used herein is for the purpose of describing particular embodiments only and is not intended to be limiting of the inventive concepts. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

In addition, unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

(Embodiments)

FIG. 1 is a schematic view showing a magnetic memory device in accordance with an embodiment of the inventive concepts.

Referring to FIG. 1, the magnetic memory device in accordance with the embodiment of the inventive concepts may include a word line WL, a bit line BL, a source line SL, a cell transistor CT, and a memory cell MC.

The bit line BL may cross the word line WL. For example, the word line WL may extend in an X-axis direction, and the bit line BL may extend in a Y-axis direction.

The source line SL may supply a common voltage. The source line SL may cross the word line WL. For example, the source line SL may extend in the Y-axis direction.

The cell transistor CT may be located between the source line SL and the memory cell MC. The cell transistor CT may include a first electrode connected to the source line SL and a second electrode connected to the memory cell MC. A gate of the cell transistor CT may be connected to the word line WL.

The memory cell MC may be located between the cell transistor CT and the bit line BL. A resistance of the memory cell MC may be changed according to a signal transferred by the word line WL and the bit line BL.

Figure 2A:
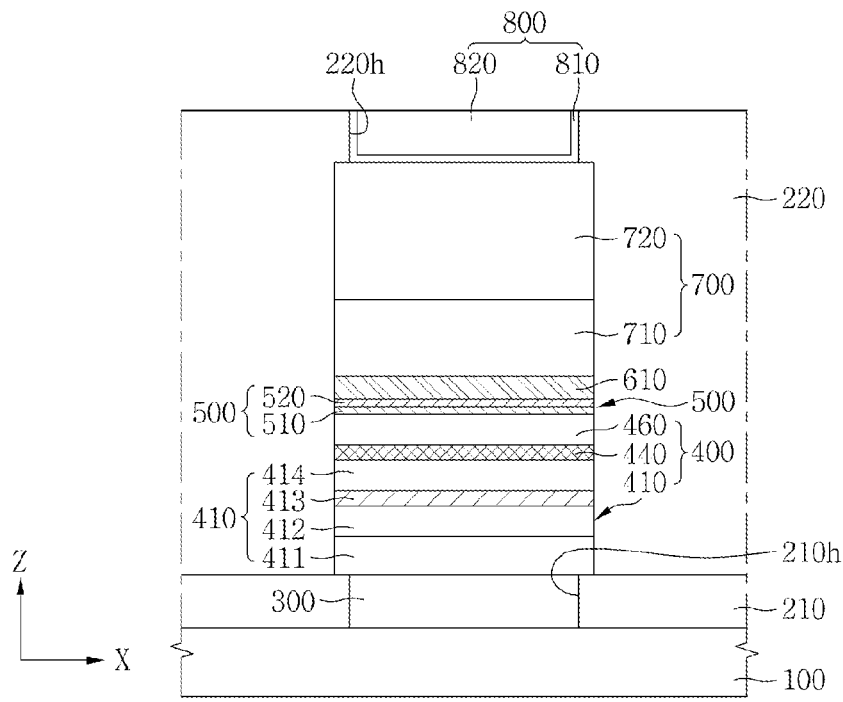
FIGS. 2A and 2B are cross-sectional views showing a memory cell of the magnetic memory device in accordance with the embodiment of the inventive concepts.
Figure 2B:
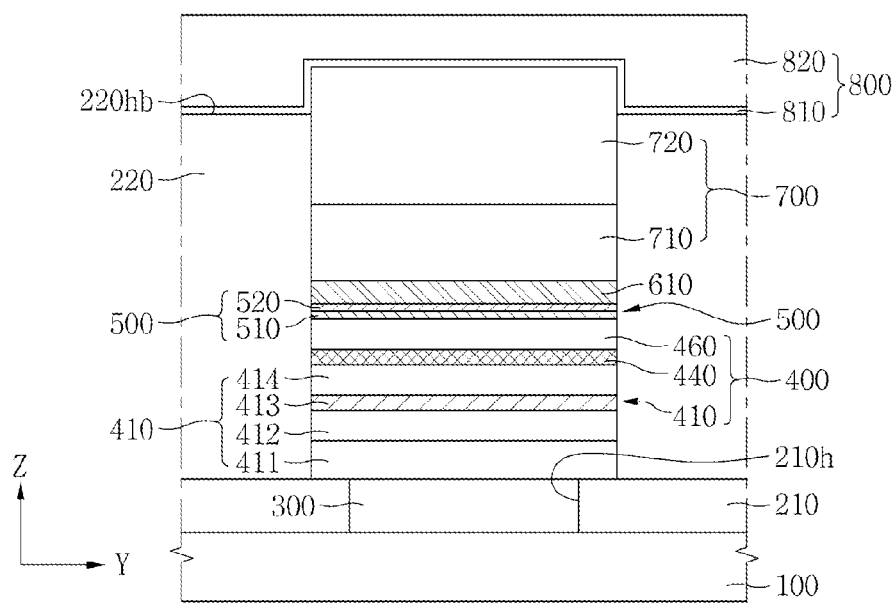

FIGS. 2A and 2B are cross-sectional views showing the memory cell MC of a magnetic memory device in accordance with some embodiments of the inventive concepts. In particular, FIG. 2A is a cross-sectional view (Z-X plane) of the memory cell MC taken along an X-direction and FIG. 2B is a cross-sectional view (Z-Y plane) of the memory cell MC taken along a Y-direction.

Referring to FIGS. 1, 2A, and 2B, the memory cell MC of the magnetic memory device may include a lower interlayer insulating layer 210, an upper interlayer insulating layer 220, a lower plug 300, a magnetic tunnel junction pattern 400, a capping pattern 500, an upper crystallinity conserving pattern 610, and an upper electrode 700.

The lower interlayer insulating layer 210 may be located on a substrate 100. The substrate 100 may be a semiconductor substrate such as a silicon substrate. The source line SL, the word line WL, and the cell transistor CT may be located between the substrate 100 and the lower interlayer insulating layer 210. The lower interlayer insulating layer 210 may include a lower contact hole 210h.

The lower interlayer insulating layer 210 may include an insulating material. For example, the lower interlayer insulating layer 210 may include silicon oxide or silicon nitride. The lower interlayer insulating layer 210 may also be comprised of a low-k material suitable for an interlayer insulating layer.

The lower plug 300 may be located in the lower contact hole 210h of the lower interlayer insulating layer 210. The lower plug 300 may be electrically connected to the cell transistor CT. An upper surface of the lower plug 300 may be located at substantially the same level as that of an upper surface of the lower interlayer insulating layer 210.

The lower plug 300 may include a conductive material. For example, the lower plug 300 may include a metal or a metal nitride.

The magnetic tunnel junction pattern 400 may be located on the lower plug 300. The magnetic tunnel junction pattern 400 may include a lower magnetic structure 410, a tunnel bather pattern 440, and an upper magnetic pattern 460.

The lower magnetic structure 410 may be located on the upper surface of the lower plug 300. The lower magnetic structure 410 may include a seed pattern 411, a first lower magnetic pattern 412, a spacer pattern 413, and a second lower magnetic pattern 414.

The seed pattern 411 may be located adjacent to the lower plug 300. The seed pattern 411 may directly contact the upper surface of the lower plug 300. The size of the seed pattern 411 may be greater than that of the lower plug 300.

A length in the Y-axis direction of the seed pattern 411 may be different from a length in the X-axis direction of the seed pattern 411. For example, the length in the Y-axis direction of the seed pattern 411 may be greater than the length in the X-axis direction of the seed pattern 411.

The seed pattern 411 may include a material having a predetermined crystal structure. For example, the seed pattern 411 may include at least one of Ru, Ti or Ta. For example, a crystal structure of the seed pattern 411 may have a hexagonal close-packed (HCP) lattice structure.

The first lower magnetic pattern 412 may be located on the seed pattern 411. The length in the X-axis direction of the first lower magnetic pattern 412 may be substantially the same as the length in the X-axis direction of the seed pattern 411. The length in the Y-axis direction of the first lower magnetic pattern 412 may be substantially the same as the length in the Y-axis direction of the seed pattern 411. The side surfaces of the first lower magnetic pattern 412 may be vertically aligned with the side surfaces of the seed pattern 411. The size of the first lower magnetic pattern 412 may be substantially the same as that of the seed pattern 411.

The first lower magnetic pattern 412 may directly contact an upper surface of the seed pattern 411. The crystal orientation of the first lower magnetic pattern 412 may be affected by the orientation of the seed pattern 411. For example, the crystal orientation of the first lower magnetic pattern 412 may be substantially the same as that of the seed pattern 411.

The first lower magnetic pattern 412 may include a magnetic material. The first lower magnetic pattern 412 may have a vertical magnetization characteristic. The magnetization direction of the first lower magnetic pattern 412 may be substantially perpendicular to an upper surface of the substrate 100. The magnetization direction of the first lower magnetic pattern 412 may be substantially parallel with a Z-axis direction. For example, the first lower magnetic pattern 412 may include at least one of Co, Fe or Ni, and at least one of Pt, Ta, Ru or Pd.

The magnetization direction of the first lower magnetic pattern 412 may be fixed. The magnetization direction of the first lower magnetic pattern 412 may not be changed by a magnetic field formed between the lower plug 300 and the upper electrode 700. For example, the first lower magnetic pattern 412 may serve as a fixed layer.

The spacer pattern 413 may be located on the first lower magnetic pattern 412. The side surfaces of the spacer pattern 413 may be vertically aligned with the side surfaces of the first lower magnetic pattern 412. The size of the spacer pattern 413 may be substantially the same as that of the first lower magnetic pattern 412.

The thickness of the spacer pattern 413 may be less than that of the first lower magnetic pattern 412. The length in the Z-axis direction of the spacer pattern 413 may be less than that of the first lower magnetic pattern 412.

The spacer pattern 413 may directly contact an upper surface of the first lower magnetic pattern 412. The spacer pattern 413 may include a material having a predetermined crystal structure. For example, the spacer pattern 413 may include one of Ru, Ir, Re, and Os. For example, a crystal structure of the spacer pattern 413 may be the same as that of the seed pattern 411.

The second lower magnetic pattern 414 may be located on the spacer pattern 413. The side surfaces of the second lower magnetic pattern 414 may be vertically aligned with the side surfaces of the spacer pattern 413. The size of the second lower magnetic pattern 414 may be substantially the same as that of the spacer pattern 413.

The second lower magnetic pattern 414 may directly contact an upper surface of the spacer pattern 413. The crystal orientation of the second lower magnetic pattern 414 may be affected by the orientation of the spacer pattern 413. For example, the crystal orientation of the second lower magnetic pattern 414 may be substantially the same as that of the spacer pattern 413.

The second lower magnetic pattern 414 may include a magnetic material. The second lower magnetic pattern 414 may have a vertical magnetization characteristic. The magnetization direction of the second lower magnetic pattern 414 may be substantially parallel with the Z-axis direction. For example, the second lower magnetic pattern 414 may include at least one of Co, Fe or Ni, at least one of B, P, As or Bi, and at least one of Pt, Ta, Ru or Pd.

The magnetization direction of the second lower magnetic pattern 414 may be fixed. The magnetization direction of the second lower magnetic pattern 414 may not be changed by a magnetic field formed between the lower plug 300 and the upper electrode 700. For example, the second lower magnetic pattern 414 may serve as a fixed layer.

The magnetization direction of the second lower magnetic pattern 414 may be different from that of the first lower magnetic pattern 412. For example, the magnetization direction of the second lower magnetic pattern 414 may be opposite to that of the first lower magnetic pattern 412.

In the magnetic memory device in accordance with some embodiments of the inventive concepts, the magnetization direction of the second lower magnetic pattern 414 of the lower magnetic structure 410 may be opposite to that of the first lower magnetic pattern 412 of the lower magnetic structure 410. That is, in the magnetic memory device in accordance with some embodiments of the inventive concepts, the lower magnetic structure 410 of the magnetic tunnel junction pattern 400 may have a synthetic anti-ferromagnetic (SAF) structure. Therefore, the distribution of a tunnel magnetic resistance (TMR) of the magnetic tunnel junction pattern 400 may be reduced.

The tunnel bather pattern 440 may be located on the lower magnetic structure 410. The side surfaces of the tunnel barrier pattern 440 may be vertically aligned with the side surfaces of the second lower magnetic pattern 414. The size of the tunnel barrier pattern 440 may be substantially the same as that of the second lower magnetic pattern 414.

The tunnel barrier pattern 440 may directly contact an upper surface of the second lower magnetic pattern 414. According to some embodiments, the crystal orientation of the second lower magnetic pattern 414 may be determined (or set) later than that of the tunnel barrier pattern 440. In the magnetic memory device in accordance with the embodiment of the inventive concepts, the crystal orientation of the second lower magnetic pattern 414 may be affected by orientations of the spacer pattern 413 and the tunnel barrier pattern 440. The orientation of the tunnel barrier pattern 440 may be substantially the same as that of the spacer pattern 413. The crystal orientation of the second lower magnetic pattern 414 may be substantially parallel with the crystal orientations of the spacer pattern 413 and the tunnel barrier pattern 440. The crystal orientation of the tunnel barrier pattern 440 may be substantially the same as that of the second lower magnetic pattern 414.

The tunnel barrier pattern 440 may have a smaller thickness than the second lower magnetic pattern 414. For example, a thickness of the tunnel barrier pattern 440 may be substantially the same as that of the spacer pattern 413.

The tunnel barrier pattern 440 may include a non-magnetic material. For example, the tunnel barrier pattern 440 may include MgO.

The upper magnetic pattern 460 may be located on the tunnel barrier pattern 440. The side surfaces of the upper magnetic pattern 460 may be vertically aligned with the side surfaces of the tunnel barrier pattern 440. The size of the upper magnetic pattern 460 may be substantially the same as that of the tunnel barrier pattern 440.

The upper magnetic pattern 460 may directly contact an upper surface of the tunnel barrier pattern 440. The crystal orientation of the upper magnetic pattern 460 may be affected by the orientation of the tunnel barrier pattern 440. For example, the crystal orientation of the upper magnetic pattern 460 may be substantially the same as that of the tunnel barrier pattern 440.

In the magnetic memory device in accordance with some embodiments, the crystal orientation of the upper magnetic pattern 460 may be determined (or set) with the crystal orientation of the second lower magnetic pattern 414. Thus, in the magnetic memory device in accordance with some embodiments of the inventive concepts, the crystal orientations of the upper magnetic pattern 460 and the second lower magnetic pattern 414 may be substantially parallel with the crystal orientation of the tunnel barrier pattern 440.

The upper magnetic pattern 460 may include a magnetic material. The upper magnetic pattern 460 may have a vertical magnetization characteristic. A magnetization direction of the upper magnetic pattern 460 may be substantially parallel with the Z-axis direction. For example, the upper magnetic pattern 460 may include at least one of Co, Fe or Ni, at least one of B, P, As or Bi, and at least one of Pt, Ta, Ru or Pd.

The upper magnetic pattern 460 may have a crystallization temperature that is substantially the same as that of the second lower magnetic pattern 414. For example, the upper magnetic pattern 460 may be formed of substantially the same materials as the second lower magnetic pattern 414. For example, the component ratio of the materials in the upper magnetic pattern 460 may be the same as that of the second lower magnetic pattern 414.

The magnetization direction of the upper magnetic pattern 460 may not be fixed. The magnetization direction of the upper magnetic pattern 460 may be changed, for example, by a magnetic field formed between the lower plug 300 and the upper electrode 700. For example, the upper magnetic pattern 460 may function as a free layer.

In the magnetic memory device in accordance with some embodiments of the inventive concepts, the TMR of the magnetic tunnel junction pattern 400 may be changed according to the magnetization direction of the upper magnetic pattern 460. For example, when the magnetization direction of the upper magnetic pattern 460 is the same as that of the second lower magnetic pattern 414, the TMR of the magnetic tunnel junction pattern 400 may be at the lowest resistance level. For example, when the magnetization direction of the upper magnetic pattern 460 is opposite to that of the second lower magnetic pattern 414, the TMR of the magnetic tunnel junction pattern 400 may be at the highest resistance level.

The capping pattern 500 may be located on the magnetic tunnel junction pattern 400. The capping pattern 500 may include a first capping pattern 510 and a second capping pattern 520.

The first capping pattern 510 may be adjacent to the upper magnetic pattern 460. The side surfaces of the first capping pattern 510 may be vertically aligned with the side surfaces of the upper magnetic pattern 460. The size of the first capping pattern 510 may be substantially the same as that of the upper magnetic pattern 460.

The first capping pattern 510 may directly contact an upper surface of the upper magnetic pattern 460. The thickness of the first capping pattern 510 may be less than that of the upper magnetic pattern 460. For example, a length in the Z-axis direction of the first capping pattern 510 may be smaller than that of the tunnel barrier pattern 440. For example, the first capping pattern 510 may include one of Ta, Al, Cu, Au, Ti, TaN or TiN.

The second capping pattern 520 may be located on the first capping pattern 510. The side surfaces of the second capping pattern 520 may be vertically aligned with the side surfaces of the first capping pattern 510. The size of the second capping pattern 520 may be substantially the same as that of the first capping pattern 510.

The second capping pattern 520 may directly contact an upper surface of the first capping pattern 510. A thickness of the second capping pattern 520 may be substantially the same as that of the first capping pattern 510. For example, the length in the Z-axis direction of the second capping pattern 520 may be substantially the same as that of the first capping pattern 510. For example, the second capping pattern 520 may include at least one of Ta, Al, Cu, Au, Ti, TaN or TiN.

The crystal orientation of the second capping pattern 520 may be different from that of the first capping pattern 510. For example, the crystal orientation of the second capping pattern 520 may be opposite to that of the first capping pattern 510.

According to some embodiments of the inventive concepts, the crystal orientation of the second capping pattern 520 may be opposite to that of the first capping pattern 510. In some embodiments, the crystal orientations of the second lower magnetic pattern 414 and the upper magnetic pattern 460 may be determined (set or fixed) after forming the second capping pattern 520. Thus, according to some embodiments, the effect of the orientation of the first capping pattern 510 on the crystal orientations of the second lower magnetic pattern 414 and the upper magnetic pattern 460 may offset an effect of an orientation of the second capping pattern 520 on the crystal orientations of the second lower magnetic pattern 414 and the upper magnetic pattern 460. Therefore, the crystal orientations of the second lower magnetic pattern 414 and the upper magnetic pattern 460 may not be affected by the capping pattern 500.

The upper crystallinity conserving pattern 610 may be located on the capping pattern 500. The side surfaces of the upper crystallinity conserving pattern 610 may be vertically aligned with the side surfaces of the second capping pattern 520. The size of the upper crystallinity conserving pattern 610 may be substantially the same as that of the second capping pattern 520.

The upper crystallinity conserving pattern 610 may directly contact an upper surface of the second capping pattern 520. The upper crystallinity conserving pattern 610 may be substantially amorphous.

In the magnetic memory device in accordance with some embodiments of the inventive concepts, an amorphous state of the upper crystallinity conserving pattern 610 may be maintained while the crystal orientations of the second lower magnetic pattern 414 and the upper magnetic pattern 460 are determined (set or fixed). To this end, in the magnetic memory device in accordance with some embodiments of the inventive concepts, the upper crystallinity conserving pattern 610 may have a crystallization temperature higher than that of the second lower magnetic pattern 414 and the upper magnetic pattern 460.

For example, the upper crystallinity conserving pattern 610 may include at least one of Fe, Co, Ni, Mn, V, Cr, Zr, Hf, Si, Mg, Al, Ga, Mo, Ti, Ru, Ta, W or Cu, at least one of B, N, P, As, Sb or Bi, and at least one of Zr, Hf, Si, Mo, Ta or Cu. For example, the upper crystallinity conserving pattern 610 may include CoFeBTa.

The upper electrode 700 may be located on the upper crystallinity conserving pattern 610. The upper electrode 700 may include a first upper electrode 710 and a second upper electrode 720.

The first upper electrode 710 may be located adjacent to the upper crystallinity conserving pattern 610. The first upper electrode 710 may directly contact an upper surface of the upper crystallinity conserving pattern 610. The side surfaces of the first upper electrode 710 may be vertically aligned with the side surfaces of the upper crystallinity conserving pattern 610. The size of the first upper electrode 710 may be substantially the same as that of the upper crystallinity conserving pattern 610.

The first upper electrode 710 may include a conductive material. For example, the first upper electrode 710 may include a metal or a metal nitride.

In the magnetic memory device in accordance with some embodiments of the inventive concepts, the crystal orientations of the second lower magnetic pattern 414 and the upper magnetic pattern 460 may be determined (set or fixed) after forming an upper electrode layer for the first upper electrode 710. The upper electrode layer for the first upper electrode 710 may be formed on an amorphous upper crystallinity conserving layer for the upper crystallinity conserving pattern 610. Thus, in the magnetic memory device in accordance with some embodiments of the inventive concepts, the effect of an orientation of the first upper electrode 710 on the crystal orientations of the second lower magnetic pattern 414 and the upper magnetic pattern 460 may be blocked by the upper crystallinity conserving pattern 610. That is, the orientation of the first upper electrode 710 may not influence the crystal orientations of the second lower magnetic pattern 414 and the upper magnetic pattern 460. Therefore, the electromagnetic characteristic of the magnetic tunnel junction pattern 400 may be improved.

The second upper electrode 720 may be located on the first upper electrode 710. The second upper electrode 720 may directly contact an upper surface of the first upper electrode 710. The side surfaces of the second upper electrode 720 may be vertically aligned with the side surfaces of the first upper electrode 710. The size of the second upper electrode 720 may be substantially the same as that of the first upper electrode 710.

The second upper electrode 720 may include a conductive material. For example, the second upper electrode 720 may include a metal or a metal nitride.

The upper interlayer insulating layer 220 may be located on the lower interlayer insulating layer 210. The upper interlayer insulating layer 220 may cover the side surfaces of the magnetic tunnel junction pattern 400, the side surfaces of the capping pattern 500, the side surfaces of the upper crystallinity conserving pattern 610, and the side surfaces of the upper electrode 700.

The upper interlayer insulating layer 220 may include an insulating material. For example, the upper interlayer insulating layer 220 may include silicon oxide or silicon nitride. Materials included in the upper interlayer insulating layer 220 may be substantially the same as materials included in the lower interlayer insulating layer 210.

The magnetic memory device in accordance with some embodiments of the inventive concepts may further include an upper interconnection 800 located on the upper electrode 700. The upper interconnection 800 may be electrically connected to the upper electrode 700. The upper interconnection 800 may extend in the Y-axis direction. For example, the upper interconnection 800 may be the bit line BL.

The length in the X-axis direction of the upper interconnection 800 may be less than that of the second upper electrode 720 as shown in FIG. 2A. The upper interconnection 800 may directly contact an upper surface of the upper electrode 700. To this end, the upper interlayer insulating layer 220 may include an upper contact hole 220*h*. The upper contact hole 220*h* may partially expose the upper surface of the upper electrode 700.

The upper contact hole 220*h* may extend in the Y-axis direction as shown in FIG. 2B. The lowest level of a bottom 220*hb* of the upper contact hole 220*h* may be lower than the level of the upper surface of the upper electrode 700. For example, side surfaces in the Y-axis direction of the second upper electrode 720 may be partially exposed by the upper contact hole 220*h*.

The upper interconnection 800 may be located in the upper contact hole 220*h*. The level of an upper surface of the upper interconnection 800 may be substantially the same as that of the upper interlayer insulating layer 220. The upper interconnection 800 may partially cover the side surfaces of the second upper electrode 720. For example, the side surfaces in the Y-direction of the second upper electrode 720 exposed by the upper contact hole 220*h* may directly contact the upper interconnection 800.

The upper interconnection 800 may include an upper barrier pattern 810 and an upper conductive pattern 820. The upper bather pattern 810 may extend along a surface of the upper contact hole 220*h*. The upper conductive pattern 820 may be located on the upper barrier pattern 810. The upper conductive pattern 820 may fill the upper contact hole 220*h*. The upper barrier pattern 810 may be located between the upper electrode 700 and the upper conductive pattern 820. The upper bather pattern 810 may be located between the upper interlayer insulating layer 220 and the upper conductive pattern 820.

According to some embodiments of the inventive concepts, the upper electrode 700 may be formed without regard to a crystallization process of the magnetic tunnel junction pattern 400. Thus, the upper electrode 700 may be formed to have a sufficient thickness. Therefore, damage to the magnetic tunnel junction pattern 400 may not be significant in the formation of the upper contact hole 220*h*. That is, the magnetic memory device in accordance with some embodiments of the inventive concepts may not be limited to one method of forming the upper interconnection 800.

In some embodiments, although not illustrated, another tunnel barrier pattern and a ferromagnetic layer pattern may be formed over the upper magnetic pattern 460 to form a dual magnetic tunnel junction (DMTJ).

Figure 3:
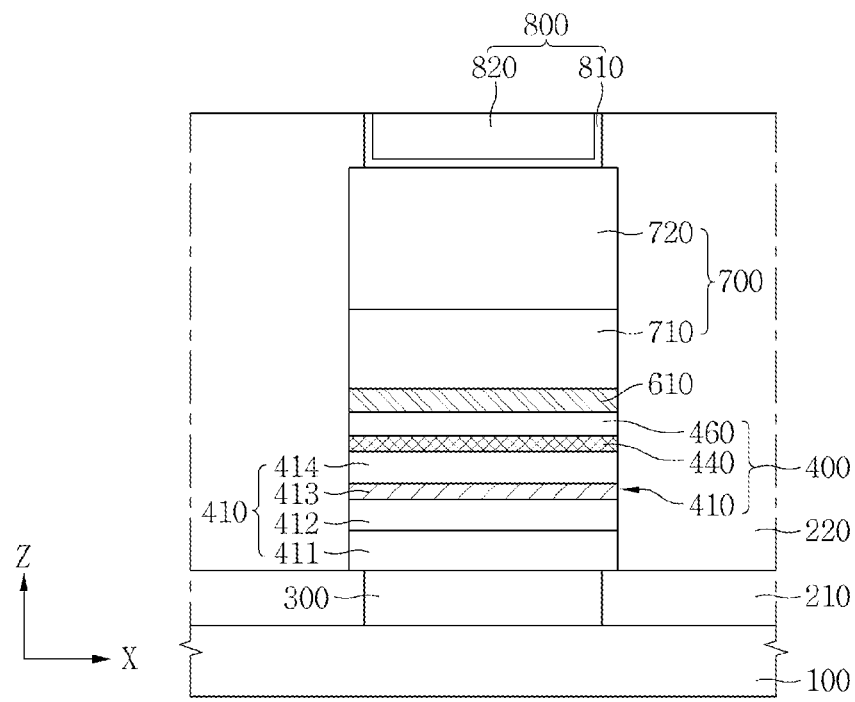
FIG. 3 is a cross-sectional view showing a magnetic memory device in accordance with another embodiment of the inventive concepts.

FIG. 3 is a cross-sectional view showing a magnetic memory device in accordance with an embodiment of the inventive concepts.

Referring to FIG. 3, the magnetic memory device in accordance with some embodiments of the inventive concepts may include a substrate 100, a lower interlayer insulating layer 210 located on the substrate 100, a lower plug 300 located in the lower interlayer insulating layer 210, a magnetic tunnel junction pattern 400 located on the lower plug 300, an upper crystallinity conserving pattern 610 located on the magnetic tunnel junction pattern 400, an upper electrode 700 located on the upper crystallinity conserving pattern 610, an upper interconnection 800 located on the upper electrode 700, and an upper interlayer insulating layer 220 which surrounds side surfaces of the magnetic tunnel junction pattern 400, sides of the upper crystallinity conserving pattern 610, sides of the upper electrode 700, and sides of the upper interconnection 800.

The magnetic tunnel junction pattern 400 may include a lower magnetic structure 410, a tunnel barrier pattern 440 located on the lower magnetic structure 410, and an upper magnetic pattern 460 located on the tunnel bather pattern 440. The lower magnetic structure 410 may include a seed pattern 411, a first lower magnetic pattern 412 located on the seed pattern 411, a spacer pattern 413 located on the first lower magnetic pattern 412, and a second lower magnetic pattern 414 located on the spacer pattern 413.

The upper crystallinity conserving pattern 610 may directly contact the magnetic tunnel junction pattern 400. For example, the upper crystallinity conserving pattern 610 may directly contact an upper surface of the upper magnetic pattern 460.

The upper electrode 700 may include a first upper electrode 710 and a second upper electrode 720 located on the first upper electrode 710. The upper interconnection 800 may include an upper barrier pattern 810 and an upper conductive pattern 820 located on the upper barrier pattern 810.

In the magnetic memory device in accordance with some embodiments of the inventive concepts, the upper crystallinity conserving pattern 610 may directly contact the magnetic tunnel junction pattern 400. Thus, the crystal orientation of the upper magnetic pattern 460 may be affected only by an orientation of the tunnel barrier pattern 440. Therefore, in the magnetic memory device in accordance with the embodiment of the inventive concepts, an electromagnetic characteristic of the magnetic tunnel junction pattern 400 may be improved.

Figure 4:
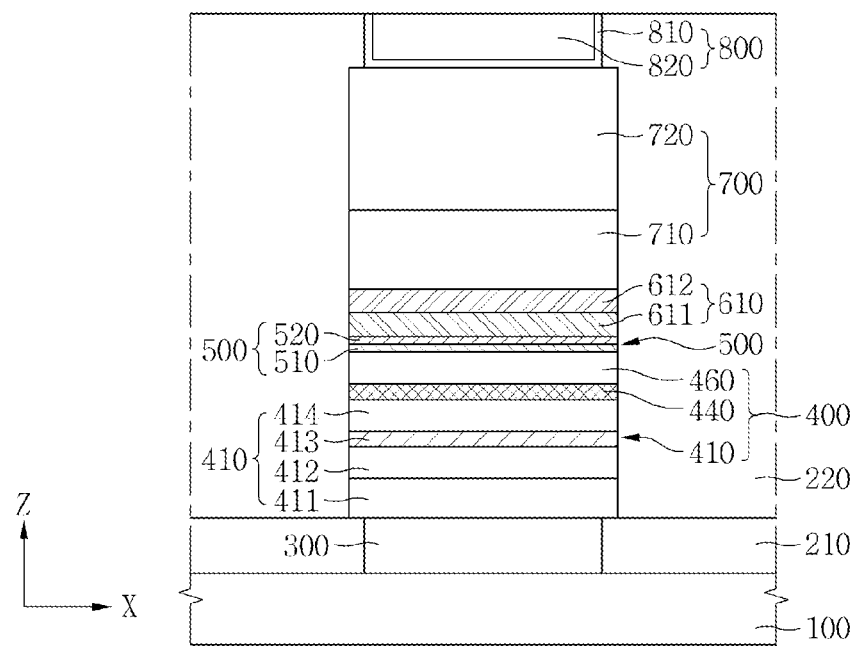
FIG. 4 is a cross-sectional view showing a magnetic memory device in accordance with still another embodiment of the inventive concepts.

FIG. 4 is a cross-sectional view showing a magnetic memory device in accordance with an embodiment of the inventive concepts.

Referring to FIG. 4, the magnetic memory device in accordance with some embodiments of the inventive concepts may include a substrate 100, a lower interlayer insulating layer 210, an upper interlayer insulating layer 220, a lower plug 300, a magnetic tunnel junction pattern 400, a capping pattern 500, an upper crystallinity conserving pattern 610, an upper electrode 700, and an upper interconnection 800.

The magnetic tunnel junction pattern 400 may include a lower magnetic structure 410, a tunnel bather pattern 440, and an upper magnetic pattern 460. The lower magnetic structure 410 may include a seed pattern 411, a first lower magnetic pattern 412, a spacer pattern 413, and a second lower magnetic pattern 414.

The capping pattern 500 may include a first capping pattern 510 and a second capping pattern 520.

The upper crystallinity conserving pattern 610 may include a first upper crystallinity conserving pattern 611 and a second upper crystallinity conserving pattern 612.

The first upper crystallinity conserving pattern 611 may be adjacent to the capping pattern 500. The side surfaces of the first upper crystallinity conserving pattern 611 may be vertically aligned with the side surfaces of the capping pattern 500. The size of the first upper crystallinity conserving pattern 611 may be substantially the same as that of the capping pattern 500.

The first upper crystallinity conserving pattern 611 may be substantially amorphous. The first upper crystallinity conserving pattern 611 may have a higher crystallization temperature than the second lower magnetic pattern 414 and the upper magnetic pattern 460.

The second upper crystallinity conserving pattern 612 may be located on the first upper crystallinity conserving pattern 611. The side surfaces of the second upper crystallinity conserving pattern 612 may be vertically aligned with the side surfaces of the first upper crystallinity conserving pattern 611. The size of the second upper crystallinity conserving pattern 612 may be substantially the same as that of the first upper crystallinity conserving pattern 611.

The second upper crystallinity conserving pattern 612 may be substantially amorphous. The second upper crystallinity conserving pattern 612 may have a higher crystallization temperature than the second lower magnetic pattern 414 and the upper magnetic pattern 460.

The second upper crystallinity conserving pattern 612 may have a different crystallization temperature from the first upper crystallinity conserving pattern 611. Materials included in the second upper crystallinity conserving pattern 612 may be the same as materials included in the first upper crystallinity conserving pattern 611. In some embodiments, the component ratio of the materials in the second upper crystallinity conserving pattern 612 may be different from that of the first upper crystallinity conserving pattern 611.

The upper electrode 700 may include a first upper electrode 710 and a second upper electrode 720. The upper interconnection 800 may include an upper barrier pattern 810 and an upper conductive pattern 820.

According to some embodiments of the inventive concepts, the upper crystallinity conserving pattern 610 may include the amorphous first upper crystallinity conserving pattern 611 and the amorphous second upper crystallinity conserving pattern 612 located on the first upper crystallinity conserving pattern 611. The second upper crystallinity conserving pattern 612 may have a different crystallization temperature from the first upper crystallinity conserving pattern 611. Therefore, in the magnetic memory device in accordance with some embodiments of the inventive concepts, an electromagnetic characteristic of the magnetic tunnel junction pattern 400 may be improved.

Figure 5:
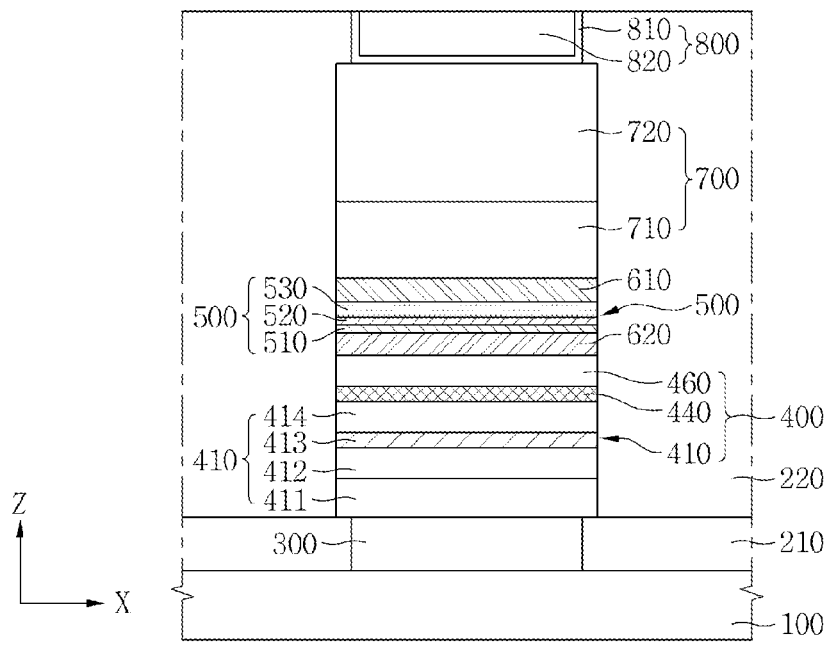
FIG. 5 is a cross-sectional view showing a magnetic memory device in accordance with yet another embodiment of the inventive concepts.

FIG. 5 is a cross-sectional view showing a magnetic memory device in accordance with an embodiment of the inventive concepts.

Referring to FIG. 5, the magnetic memory device in accordance with some embodiments of the inventive concepts may include a substrate 100, a lower interlayer insulating layer 210, an upper interlayer insulating layer 220, a lower plug 300, a magnetic tunnel junction pattern 400, a capping pattern 500, an upper crystallinity conserving pattern 610, an intermediate crystallinity conserving pattern 620, an upper electrode 700, and an upper interconnection 800.

The magnetic tunnel junction pattern 400 may include a lower magnetic structure 410, a tunnel bather pattern 440, and an upper magnetic pattern 460. The lower magnetic structure 410 may include a seed pattern 411, a first lower magnetic pattern 412, a spacer pattern 413, and a second lower magnetic pattern 414.

The capping pattern 500 may include a first capping pattern 510, a second capping pattern 520, and a third capping pattern 530. The second capping pattern 520 may be located between the first capping pattern 510 and the third capping pattern 530. The third capping pattern 530 may be located close to the upper crystallinity conserving pattern 610. The upper crystallinity conserving pattern 610 may directly contact an upper surface of the third capping pattern 530.

The side surfaces of the third capping pattern 530 may be vertically aligned with the side surfaces of the second capping pattern 520. The size of the third capping pattern 530 may be substantially the same as that of the second capping pattern 520.

A thickness of the third capping pattern 530 may be greater than that of the second capping pattern 520. For example, a length in the Z-axis direction of the capping pattern 500 may be greater than that of the tunnel barrier pattern 440. For example, the length in the Z-axis direction of the capping pattern 500 may be the same as that of the upper magnetic pattern 460. For example, the third capping pattern 530 may include one of Ta, Al, Cu, Au, Ti, TaN or TiN.

A crystal orientation of the third capping pattern 530 may be different from that of the tunnel barrier pattern 440. For example, the crystal orientation of the third capping pattern 530 may be the same as that of the first capping pattern 510 or that of the second capping pattern 520.

The intermediate crystallinity conserving pattern 620 may be located between the magnetic tunnel junction pattern 400 and the capping pattern 500. The side surfaces of the intermediate crystallinity conserving pattern 620 may be vertically aligned with sides of the magnetic tunnel junction pattern 400. The size of the intermediate crystallinity conserving pattern 620 may be substantially the same as that of the magnetic tunnel junction pattern 400.

The intermediate crystallinity conserving pattern 620 may directly contact an upper surface of the upper magnetic pattern 460. The intermediate crystallinity conserving pattern 620 may be substantially amorphous.

The intermediate crystallinity conserving pattern 620 may have a higher crystallization temperature than the second lower magnetic pattern 414 and the upper magnetic pattern 460. For example, the intermediate crystallinity conserving pattern 620 may have a crystallization temperature that is substantially the same as that of the upper crystallinity conserving pattern 610.

For example, the intermediate crystallinity conserving pattern 620 may include at least one of Fe, Co, Ni, Mn, V, Cr, Zr, Hf, Si, Mg, Al, Ga, Mo, Ti, Ru, Ta, W or Cu, at least one of B, N, P, As, Sb or Bi, and at least one of Zr, Hf, Si, Mo, Ta or Cu. The intermediate crystallinity conserving pattern 620 may include the same materials as the upper crystallinity conserving pattern 610. For example, the intermediate crystallinity conserving pattern 620 may be CoFeBTa.

The upper electrode 700 may include a first upper electrode 710 and a second upper electrode 720. The upper interconnection 800 may include an upper barrier pattern 810 and an upper conductive pattern 820.

In the magnetic memory device in accordance with some embodiments of the inventive concepts, the amorphous intermediate crystallinity conserving pattern 620 may be located between the magnetic tunnel junction pattern 400 and the capping pattern 500. Thus, in the magnetic memory device in accordance with some embodiments of the inventive concepts, the capping pattern 500 may be formed without regard to a crystallization process of the magnetic tunnel junction pattern 400. That is, the capping pattern 500 may be formed to have a sufficient thickness. Therefore, in the magnetic memory device in accordance with the embodiment of the inventive concepts, an electromagnetic characteristic of the magnetic tunnel junction pattern 400 may be improved.

Figure 6:
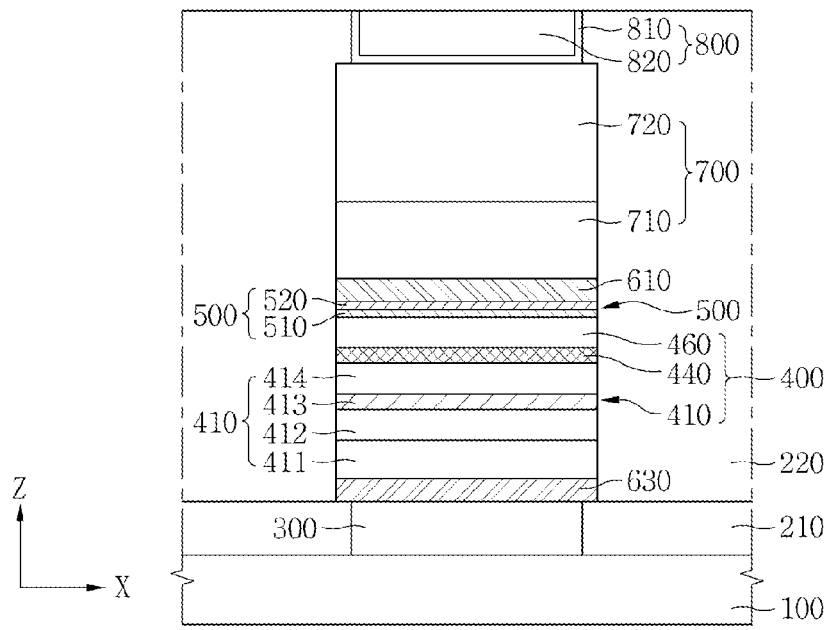
FIG. 6 is a cross-sectional view showing a magnetic memory device in accordance with yet another embodiment of the inventive concepts.

FIG. 6 is a cross-sectional view showing a magnetic memory device in accordance with an embodiment of the inventive concepts.

Referring to FIG. 6, the magnetic memory device in accordance with the embodiment of the inventive concepts may include a substrate 100, a lower interlayer insulating layer 210, an upper interlayer insulating layer 220, a lower plug 300, a magnetic tunnel junction pattern 400, a capping pattern 500, an upper crystallinity conserving pattern 610, a lower crystal protection pattern 630, an upper electrode 700, and an upper interconnection 800.

The magnetic tunnel junction pattern 400 may include a lower magnetic structure 410, a tunnel bather pattern 440, and an upper magnetic pattern 460. The lower magnetic structure 410 may include a seed pattern 411, a first lower magnetic pattern 412, a spacer pattern 413, and a second lower magnetic pattern 414.

The capping pattern 500 may include a first capping pattern 510 and a second capping pattern 520.

The lower crystal protection pattern 630 may be located between the lower plug 300 and the magnetic tunnel junction pattern 400. Sides of the lower crystal protection pattern 630 may be vertically aligned with sides of the magnetic tunnel junction pattern 400. A size of the lower crystal protection pattern 630 may be the same as that of the magnetic tunnel junction pattern 400.

The lower crystal protection pattern 630 may directly contact a bottom of the seed pattern 411. The lower crystal protection pattern 630 may be substantially amorphous.

The lower crystal protection pattern 630 may have a higher crystallization temperature than the second lower magnetic pattern 414 and the upper magnetic pattern 460. For example, the lower crystal protection pattern 630 may have a crystallization temperature that is substantially the same as that of the upper crystallinity conserving pattern 610.

For example, the lower crystal protection pattern 630 may include at least one of Fe, Co, Ni, Mn, V, Cr, Zr, Hf, Si, Mg, Al, Ga, Mo, Ti, Ru, Ta, W or Cu, at least one of B, N, P, As, Sb or Bi, and at least one of Zr, Hf, Si, Mo, Ta or Cu. The lower crystal protection pattern 630 may include substantially the same materials as those of the upper crystallinity conserving pattern 610. For example, the lower crystal protection pattern 630 may be CoFeBTa.

The upper electrode 700 may include a first upper electrode 710 and a second upper electrode 720. The upper interconnection 800 may include an upper barrier pattern 810 and an upper conductive pattern 820.

In the magnetic memory device in accordance with the embodiment of the inventive concepts, the amorphous lower crystal protection pattern 630 may be located between the lower plug 300 and the magnetic tunnel junction pattern 400. Thus, in the magnetic memory device in accordance with the embodiment of the inventive concepts, a crystal orientation of the seed pattern 411 may be determined without being affected by an orientation of the lower plug 300. That is, in the magnetic memory device in accordance with the embodiment of the inventive concepts, a material of the lower plug 300 may be selected without regard to a crystallization process of the magnetic tunnel junction pattern 400. Therefore, in the magnetic memory device in accordance with the embodiment of the inventive concepts, an electromagnetic characteristic of the magnetic tunnel junction pattern 400 may be improved.

Figure 7:
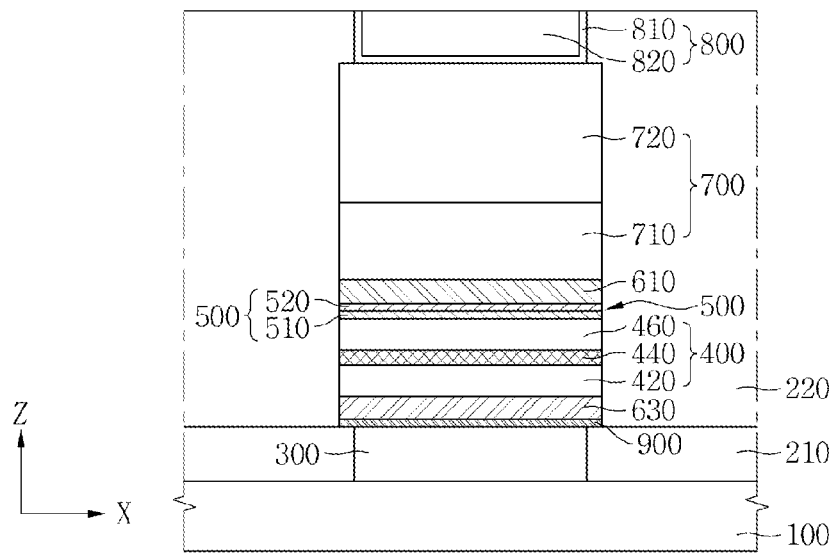
FIG. 7 is a cross-sectional view showing a magnetic memory device in accordance with yet another embodiment of the inventive concepts.

FIG. 7 is a cross-sectional view showing a magnetic memory device in accordance with an embodiment of the inventive concepts.

Referring to FIG. 7, the magnetic memory device in accordance with some embodiments of the inventive concepts may include a substrate 100, a lower interlayer insulating layer 210, an upper interlayer insulating layer 220, a lower plug 300, a magnetic tunnel junction pattern 400, a capping pattern 500, an upper crystallinity conserving pattern 610, a lower crystal protection pattern 630, an upper electrode 700, an upper interconnection 800, and an adhesive pattern 900.

The magnetic tunnel junction pattern 400 may include a lower magnetic pattern 420, a tunnel bather pattern 440, and an upper magnetic pattern 460.

The lower magnetic pattern 420 may be located adjacent to the lower plug 300. The side surfaces of the lower magnetic pattern 420 may be vertically aligned with side surfaces of the tunnel barrier pattern 440. The size of the lower magnetic pattern 420 may be substantially the same as that of the tunnel barrier pattern 440.

The lower magnetic pattern 420 may include a magnetic material. The lower magnetic pattern 420 may have a vertical magnetization characteristic. A magnetization direction of the lower magnetic pattern 420 may be substantially parallel with the Z-axis direction. For example, the lower magnetic pattern 420 may include at least one of Co, Fe, or Ni, at least one of B, P, As, or Bi, and at least one of Pt, Ta, Ru, or Pd.

The magnetization direction of the lower magnetic pattern 420 may be fixed. The magnetization direction of the lower magnetic pattern 420 may not be changed by a magnetic field formed between the lower plug 300 and the upper electrode 700. For example, the lower magnetic pattern 420 may serve as a fixed layer.

In some embodiments, the crystal orientation of the lower magnetic pattern 420 may be determined (set or fixed) later than that of the tunnel barrier pattern 440. Thus, the crystal orientation of the lower magnetic pattern 420 may be affected by an orientation of the tunnel barrier pattern 440. For example, the crystal orientation of the lower magnetic pattern 420 may be the same as that of the tunnel barrier pattern 440.

In the magnetic memory device in accordance with the embodiment of the inventive concepts, the crystal orientation of the lower magnetic pattern 420 may be simultaneously determined with the crystal orientation of the upper magnetic pattern 460. For example, the crystal orientation of the lower magnetic pattern 420 may be the same as that of the upper magnetic pattern 460.

The capping pattern 500 may include a first capping pattern 510 and a second capping pattern 520. The upper electrode 700 may include a first upper electrode 710 and a second upper electrode 720. The upper interconnection 800 may include an upper barrier pattern 810 and an upper conductive pattern 820.

The adhesive pattern 900 may be located between the lower plug 300 and the lower crystal protection pattern 630. The side surfaces of the adhesive pattern 900 may be vertically aligned with the side surfaces of the lower crystal protection pattern 630. The size of the adhesive pattern 900 may be substantially the same as that of the lower crystal protection pattern 630. The adhesive pattern 900 may include a conductive adhesive material.

The magnetic memory device in accordance with the embodiment of the inventive concepts may include the lower crystal protection pattern 630 located between the lower plug 300 and the lower magnetic pattern 420, and the adhesive pattern 900 located between the lower plug 300 and the lower crystal protection pattern 630. Thus, in the magnetic memory device in accordance with some embodiments of the inventive concepts, the lower crystal protection pattern 630 may be firmly attached to the lower plug 300. That is, the material of the lower plug 300 may be selected without regard to an adhesion with the lower crystal protection pattern 630. Therefore, in the magnetic memory device in accordance with the embodiment of the inventive concepts, an electromagnetic characteristic of the magnetic tunnel junction pattern 400 may be improved.

Figure 8:
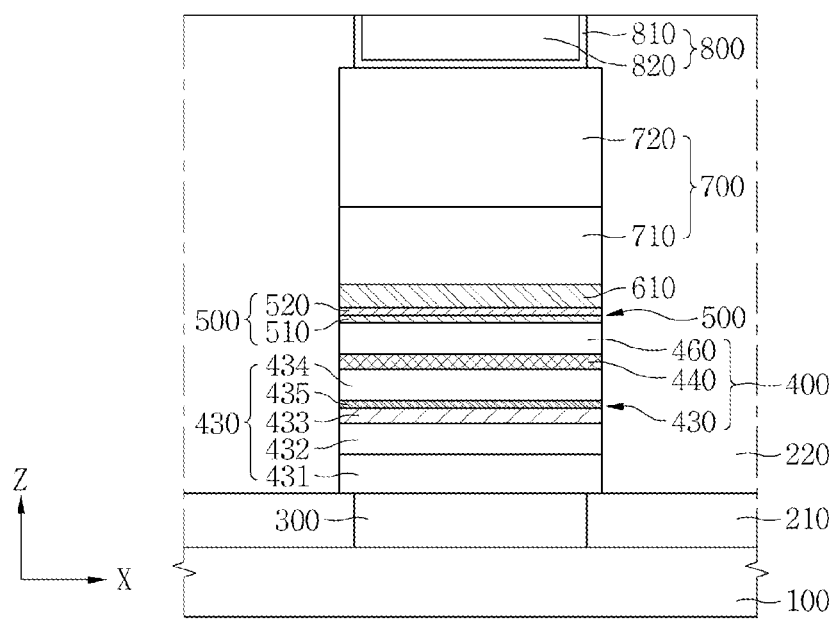
FIG. 8 is a cross-sectional view showing a magnetic memory device in accordance with yet another embodiment of the inventive concepts.

FIG. 8 is a cross-sectional view showing a magnetic memory device in accordance with an embodiment of the inventive concepts.

Referring to FIG. 8, the magnetic memory device in accordance with the embodiment of the inventive concepts may include a substrate 100, a lower interlayer insulating layer 210, an upper interlayer insulating layer 220, a lower plug 300, a magnetic tunnel junction pattern 400, a capping pattern 500, an upper crystallinity conserving pattern 610, an upper electrode 700, and an upper interconnection 800.

The magnetic tunnel junction pattern 400 may include a lower magnetic structure 430, a tunnel bather pattern 440, and an upper magnetic pattern 460. The lower magnetic structure 430 may include a seed pattern 431, a first lower magnetic pattern 432, a lower spacer pattern 433, a second lower magnetic pattern 434, and a lower interlayer crystallinity conserving pattern 435.

The seed pattern 431 may be located close to the lower plug 300. The first lower magnetic pattern 432 may be located on the seed pattern 431. The lower spacer pattern 433 may be located on the first lower magnetic pattern 432. The second lower magnetic pattern 434 may be located adjacent to the tunnel barrier pattern 440.

The lower interlayer crystallinity conserving pattern 435 may be located between the lower spacer pattern 433 and the second lower magnetic pattern 434. The side surfaces of the lower interlayer crystallinity conserving pattern 435 may be vertically aligned with the side surfaces of the second lower magnetic pattern 434. The size of the lower interlayer crystallinity conserving pattern 435 may be substantially the same as that of the second lower magnetic pattern 434.

The lower interlayer crystallinity conserving pattern 435 may directly contact a bottom of the second lower magnetic pattern 434. The lower interlayer crystallinity conserving pattern 435 may be substantially amorphous.

The lower interlayer crystallinity conserving pattern 435 may have a higher crystallization temperature than the second lower magnetic pattern 434 and the upper magnetic pattern 460. In some embodiments, the lower interlayer crystallinity conserving pattern 435 may have a crystallization temperature that is substantially the same as that of the upper crystallinity conserving pattern 610.

In some embodiments, the lower interlayer crystallinity conserving pattern 435 may include at least one of Fe, Co, Ni, Mn, V, Cr, Zr, Hf, Si, Mg, Al, Ga, Mo, Ti, Ru, Ta, W or Cu, at least one of B, N, P, As, Sb or Bi, and at least one of Zr, Hf, Si, Mo, Ta or Cu. The lower interlayer crystallinity conserving pattern 435 may include substantially the same material as the upper crystallinity conserving pattern 610. In some embodiments, the lower interlayer crystallinity conserving pattern 435 may be CoFeBTa.

A thickness of the lower interlayer crystallinity conserving pattern 435 may be less than that of the second lower magnetic pattern 434. The thickness of the lower interlayer crystallinity conserving pattern 435 may be less than that of lower spacer pattern 433. For example, a length in the Z-axis direction of the lower interlayer crystallinity conserving pattern 435 may be less than that of lower spacer pattern 433.

With some of these features of the inventive concepts, a distribution of a TMR of the magnetic tunnel junction pattern 400 may be reduced by the lower magnetic structure 430 having an SAF structure which includes the lower interlayer crystallinity conserving pattern 435.

The capping pattern 500 may include a first capping pattern 510 and a second capping pattern 520. The upper electrode 700 may include a first upper electrode 710 and a second upper electrode 720. The upper interconnection 800 may include an upper barrier pattern 810 and an upper conductive pattern 820.

In some embodiments, the lower magnetic structure 430 may include the amorphous lower interlayer crystallinity conserving pattern 435 located between the lower spacer pattern 433 and the second lower magnetic pattern 434. Thus, in the magnetic memory device in accordance with the embodiment of the inventive concepts, the crystal orientation of the second lower magnetic pattern 434 may not be affected by the crystal orientation of the seed pattern 431. That is, in the magnetic memory device in accordance with some embodiments of the inventive concepts, a material of the seed pattern 431 may be selected without regard to the TMR of the magnetic tunnel junction pattern 400. Therefore, the electromagnetic characteristic of the magnetic tunnel junction pattern 400 may be improved.

Figure 9:
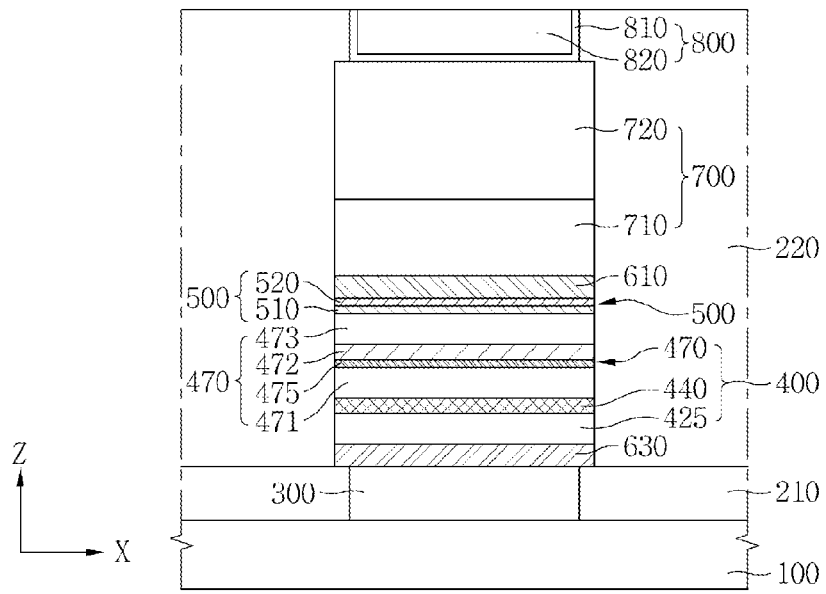
FIG. 9 is a cross-sectional view showing a magnetic memory device in accordance with yet another embodiment of the inventive concepts.

FIG. 9 is a cross-sectional view showing a magnetic memory device in accordance with an embodiment of the inventive concepts.

Referring to FIG. 9, the magnetic memory device in accordance with the embodiment of the inventive concepts may include a substrate 100, a lower interlayer insulating layer 210, an upper interlayer insulating layer 220, a lower plug 300, a magnetic tunnel junction pattern 400, a capping pattern 500, an upper crystallinity conserving pattern 610, a lower crystal protection pattern 630, an upper electrode 700, and an upper interconnection 800.

The magnetic tunnel junction pattern 400 may include a lower magnetic pattern 425, a tunnel bather pattern 440, and an upper magnetic structure 470.

The lower magnetic pattern 425 may be located close to the lower plug 300. The side surfaces of the lower magnetic pattern 425 may be vertically aligned with the side surfaces of the tunnel barrier pattern 440. The size of the lower magnetic pattern 425 may be substantially the same as that of the tunnel barrier pattern 440.

The lower magnetic pattern 425 may be located between the tunnel barrier pattern 440 and the lower crystal protection pattern 630. In some embodiments, the crystal orientation of the lower magnetic pattern 425 may be determined later than the crystal orientation of the tunnel barrier pattern 440. Thus, the crystal orientation of the lower magnetic pattern 425 may be affected by the orientation of the tunnel barrier pattern 440. For example, the crystal orientation of the lower magnetic pattern 425 may be the same as that of the tunnel barrier pattern 440.

The lower magnetic pattern 425 may include a magnetic material. The lower magnetic pattern 425 may have a vertical magnetization characteristic. The magnetization direction of the lower magnetic pattern 425 may be substantially parallel with the Z-axis direction. For example, the lower magnetic pattern 425 may include at least one of Co, Fe or Ni, at least one of B, P, As or Bi, and at least one of Pt, Ta, Ru or Pd.

The magnetization direction of the lower magnetic pattern 425 may not be fixed. The magnetization direction of the lower magnetic pattern 425 may be changed, for example, by a magnetic field formed between the lower plug 300 and the upper electrode 700. For example, the lower magnetic pattern 425 may serve as a free layer.

The upper magnetic structure 470 may be located on the tunnel barrier pattern 440. The tunnel barrier pattern 440 may be located between the lower magnetic pattern 425 and the upper magnetic structure 470. The upper magnetic structure 470 may include a first upper magnetic pattern 471, an upper spacer pattern 472, a second upper magnetic pattern 473, and an upper interlayer crystallinity conserving pattern 475.

The first upper magnetic pattern 471 may be located close to the tunnel barrier pattern 440. The side surfaces of the first upper magnetic pattern 471 may be vertically aligned with the side surfaces of the tunnel barrier pattern 440. The size of the first upper magnetic pattern 471 may be substantially the same as that of the tunnel barrier pattern 440.

The first upper magnetic pattern 471 may directly contact an upper surface of the tunnel barrier pattern 440. In some embodiments, the crystal orientation of the first upper magnetic pattern 471 may be simultaneously determined or fixed with the crystal orientation of the lower magnetic pattern 425. Thus, in the magnetic memory device in accordance with some embodiments of the inventive concepts, the crystal orientation of the first upper magnetic pattern 471 may be affected by the orientation of the tunnel barrier pattern 440. For example, the crystal orientation of the first upper magnetic pattern 471 may be the same as that of the tunnel barrier pattern 440. For example, the crystal orientations of the first upper magnetic pattern 471 and the lower magnetic pattern 425 may be substantially parallel with the crystal orientation of the tunnel barrier pattern 440.

The first upper magnetic pattern 471 may include a magnetic material. The first upper magnetic pattern 471 may have a vertical magnetization characteristic. The magnetization direction of the first upper magnetic pattern 471 may be substantially parallel with the Z-axis direction. For example, the first upper magnetic pattern 471 may include at least one of Co, Fe or Ni, at least one of B, P, As or Bi, and at least one of Pt, Ta, Ru or Pd.

The first upper magnetic pattern 471 may have a crystallization temperature that is substantially the same as that of the lower magnetic pattern 425. For example, the first upper magnetic pattern 471 may be formed of the same materials as the lower magnetic pattern 425.

The magnetization direction of the first upper magnetic pattern 471 may be fixed. The magnetization direction of the first upper magnetic pattern 471 may not be changed by a magnetic field formed between the lower plug 300 and the upper electrode 700. For example, the first upper magnetic pattern 471 may serve as a fixed layer or a reference layer.

The upper spacer pattern 472 may be located on the first upper magnetic pattern 471. The side surfaces of the upper spacer pattern 472 may be vertically aligned with the side surfaces of the first upper magnetic pattern 471. The size of the upper spacer pattern 472 may be the same as that of the first upper magnetic pattern 471.

The thickness of the upper spacer pattern 472 may be less than that of the first upper magnetic pattern 471. A length in the Z-axis direction of the upper spacer pattern 472 may be less than that of the first upper magnetic pattern 471.

The upper spacer pattern 472 may include a material having a predetermined crystal structure. For example, the upper spacer pattern 472 may include one of Ru, Ir, Re or Os.

The second upper magnetic pattern 473 may be located on the upper spacer pattern 472. Sides of the second upper magnetic pattern 473 may be vertically aligned with the sides of the upper spacer pattern 472. A size of the second upper magnetic pattern 473 may be the same as that of the upper spacer pattern 472.

The second upper magnetic pattern 473 may directly contact an upper surface of the upper spacer pattern 472. The crystal orientation of the second upper magnetic pattern 473 may be affected by the orientation of the upper spacer pattern 472. For example, the crystal orientation of the second upper magnetic pattern 473 may be the same as that of the upper spacer pattern 472.

The second upper magnetic pattern 473 may include a magnetic material. The second upper magnetic pattern 473 may have a vertical magnetization characteristic. A magnetization direction of the second upper magnetic pattern 473 may be in parallel with the Z-axis direction. For example, the second upper magnetic pattern 473 may include at least one of Co, Fe or Ni and at least one of Pt, Ta, Ru or Pd.

The magnetization direction of the second upper magnetic pattern 473 may be fixed. The magnetization direction of the second upper magnetic pattern 473 may not be changed by a magnetic field formed between the lower plug 300 and the upper electrode 700. For example, the second upper magnetic pattern 473 may serve as a fixed layer.

The magnetization direction of the second upper magnetic pattern 473 may be different from that of the first upper magnetic pattern 471. For example, the magnetization direction of the second upper magnetic pattern 473 may be opposite to that of the first upper magnetic pattern 471. In the magnetic memory device in accordance with the embodiment of the inventive concepts, the upper magnetic structure 470 of the magnetic tunnel junction pattern 400 may have an SAF structure.

The upper interlayer crystallinity conserving pattern 475 may be located between the first upper magnetic pattern 471 and the upper spacer pattern 472. Sides of the upper interlayer crystallinity conserving pattern 475 may be vertically aligned with the sides of the first upper magnetic pattern 471. A size of the upper interlayer crystallinity conserving pattern 475 may be the same as that of the first upper magnetic pattern 471.

The upper interlayer crystallinity conserving pattern 475 may directly contact an upper surface of the first upper magnetic pattern 471. The upper interlayer crystallinity conserving pattern 475 may be substantially amorphous.

The upper interlayer crystallinity conserving pattern 475 may have a higher crystallization temperature than the lower magnetic pattern 425 and the first upper magnetic pattern 471. For example, the upper interlayer crystallinity conserving pattern 475 may have a crystallization temperature that is substantially the same as that of the upper crystallinity conserving pattern 610.

For example, the upper interlayer crystallinity conserving pattern 475 may include at least one of Fe, Co, Ni, Mn, V, Cr, Zr, Hf, Si, Mg, Al, Ga, Mo, Ti, Ru, Ta, W or Cu, one of B, N, P, As, Sb or Bi, and at least one of Zr, Hf, Si, Mo, Ta or Cu. The upper interlayer crystallinity conserving pattern 475 may include the same materials as the upper crystallinity conserving pattern 610. For example, the upper interlayer crystallinity conserving pattern 475 may be CoFeBTa.

The thickness of the upper interlayer crystallinity conserving pattern 475 may be less than that of the upper spacer pattern 472. For example, a length in the Z-axis direction of the upper interlayer crystallinity conserving pattern 475 may be less than that of the upper spacer pattern 472.

The capping pattern 500 may include a first capping pattern 510 and a second capping pattern 520. The upper electrode 700 may include a first upper electrode 710 and a second upper electrode 720. The upper interconnection 800 may include an upper barrier pattern 810 and an upper conductive pattern 820.

The magnetic memory device in accordance with some embodiments of the inventive concepts may include the lower crystal protection pattern 630 located between the lower plug 300 and the lower magnetic pattern 425. Further, the upper magnetic structure 470 may include the amorphous upper interlayer crystallinity conserving pattern 475 located between the first upper magnetic pattern 471 and the upper spacer pattern 472. Thus, in the magnetic memory device in accordance with the embodiment of the inventive concepts, the lower plug 300 and an SAF structure may be formed without regard to the TMR of the magnetic tunnel junction pattern 400. Therefore, in the magnetic memory device in accordance with the embodiment of the inventive concepts, an electromagnetic characteristic of the magnetic tunnel junction pattern 400 may be improved.

Figure 10:
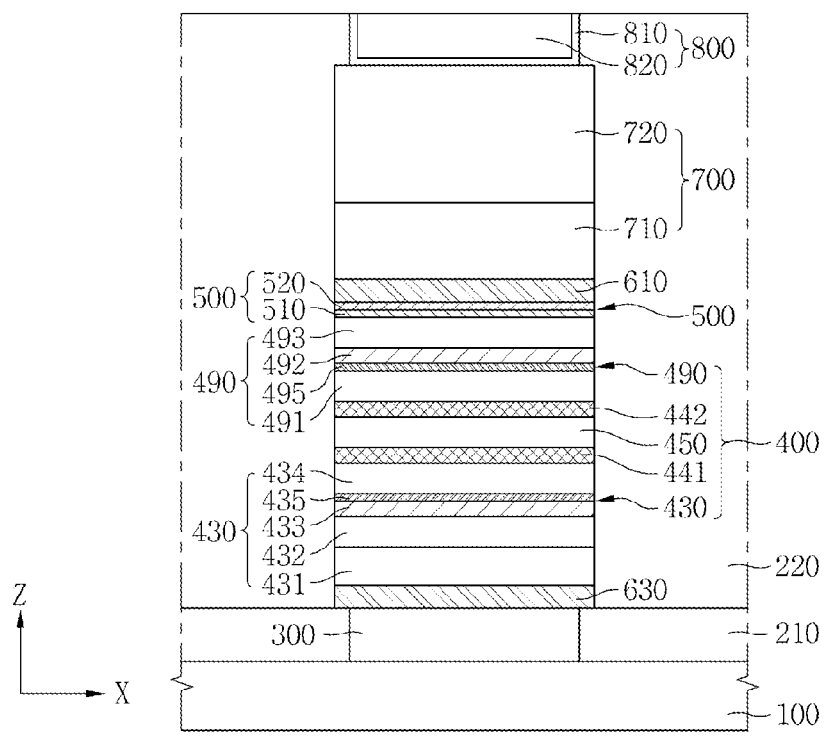
FIG. 10 is a cross-sectional view showing a magnetic memory device in accordance with yet another embodiment of the inventive concepts.
Figure 11:
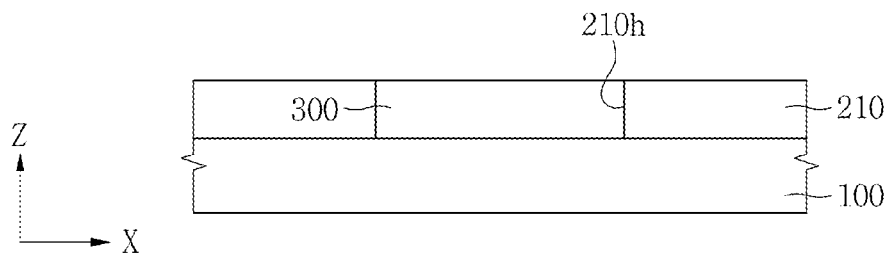
FIGS. 11 to 33B are cross-sectional views sequentially showing a method of forming a magnetic memory device in accordance with an embodiment of the inventive concepts.

FIG. 10 is a cross-sectional view showing a magnetic memory device in accordance with an embodiment of the inventive concepts.

Referring to FIG. 10, the magnetic memory device may include a substrate 100, a lower interlayer insulating layer 210, an upper interlayer insulating layer 220, a lower plug 300, a magnetic tunnel junction pattern 400, a capping pattern 500, an upper crystallinity conserving pattern 610, a lower crystal protection pattern 630, an upper electrode 700, and an upper interconnection 800.

The magnetic tunnel junction pattern 400 may include a lower magnetic structure 430, a first tunnel barrier pattern 441, an intermediate magnetic pattern 450, a second tunnel barrier pattern 442, and an upper magnetic structure 490. CLAIM?

The lower magnetic structure 430 may include a seed pattern 431, a first lower magnetic pattern 432, a lower spacer pattern 433, a second lower magnetic pattern 434, and a lower interlayer crystallinity conserving pattern 435.

The first tunnel barrier pattern 441 may be located on the lower magnetic structure 430. The side surfaces of the first tunnel barrier pattern 441 may be vertically aligned with the side surfaces of the lower magnetic structure 430. The size of the first tunnel barrier pattern 441 may be the same as that of the lower magnetic structure 430.

The first tunnel barrier pattern 441 may directly contact an upper surface of the second lower magnetic pattern 434. In the magnetic memory device in accordance with the embodiment of the inventive concepts, the crystal orientation of the second lower magnetic pattern 434 may be determined (set or fixed) later than that of the first tunnel barrier pattern 441. Thus, the crystal orientation of the second lower magnetic pattern 434 may be affected by the crystal orientation of the first tunnel barrier pattern 441. For example, the crystal orientation of the second lower magnetic pattern 434 may be the same as that of the first tunnel barrier pattern 441.

The intermediate magnetic pattern 450 may be located on the first tunnel barrier pattern 441. The side surfaces of the intermediate magnetic pattern 450 may be vertically aligned with the side surfaces of the first tunnel barrier pattern 441. The size of the intermediate magnetic pattern 450 may be substantially the same as that of the first tunnel barrier pattern 441.

The intermediate magnetic pattern 450 may directly contact an upper surface of the first tunnel barrier pattern 441. The crystal orientation of the intermediate magnetic pattern 450 may be affected by the crystal orientation of the first tunnel barrier pattern 441. For example, the crystal orientation of the intermediate magnetic pattern 450 may be the same as that of the first tunnel barrier pattern 441.

In some embodiments, the crystal orientation of the intermediate magnetic pattern 450 may be simultaneously determined (set or fixed) with that of the second lower magnetic pattern 434. For example, the crystal orientations of the second lower magnetic pattern 434 and the intermediate magnetic pattern 450 may be substantially parallel with the crystal orientation of the first tunnel barrier pattern 441.

The intermediate magnetic pattern 450 may include a magnetic material. The intermediate magnetic pattern 450 may have a vertical magnetization characteristic. A magnetization direction of the intermediate magnetic pattern 450 may be substantially parallel with the Z-axis direction. For example, the intermediate magnetic pattern 450 may include at least one of Co, Fe or Ni, at least one of B, P, As or Bi, and at least one of Pt, Ta, Ru or Pd.

The intermediate magnetic pattern 450 may have a crystallization temperature that is substantially the same as that of the second lower magnetic pattern 434. For example, the intermediate magnetic pattern 450 may be formed of the same materials as the second lower magnetic pattern 434.

The magnetization direction of the intermediate magnetic pattern 450 may not be fixed. The magnetization direction of the intermediate magnetic pattern 450 may be changed, for example, by a magnetic field formed between the lower plug 300 and the upper interconnection 800. For example, the intermediate magnetic pattern 450 may serve as a free layer.

The second tunnel barrier pattern 442 may be located on the intermediate magnetic pattern 450. The side surfaces of the second tunnel barrier pattern 442 may be vertically aligned with the side surfaces of the intermediate magnetic pattern 450. The size of the second tunnel barrier pattern 442 may be substantially the same as that of the intermediate magnetic pattern 450.

The second tunnel barrier pattern 442 may directly contact an upper surface of the intermediate magnetic pattern 450. In the magnetic memory device in accordance with some embodiments of the inventive concepts, the crystal orientation of the second tunnel barrier pattern 442 may be determined (set or fixed) prior to that of the intermediate magnetic pattern 450. Thus, the crystal orientation of the intermediate magnetic pattern 450 may be affected by the crystal orientations of the first tunnel barrier pattern 441 and the second tunnel barrier pattern 442. The crystal orientation of the second tunnel barrier pattern 442 may be substantially the same as that of the first tunnel barrier pattern 441. For example, the crystal orientation of the intermediate magnetic pattern 450 may be substantially parallel with the crystal orientations of the first tunnel barrier pattern 441 and the second tunnel barrier pattern 442.

The upper magnetic structure 490 may be located on the second tunnel bather pattern 442. The upper magnetic structure 490 may include a first upper magnetic structure 491, an upper spacer pattern 492, a second upper magnetic structure 493, and an upper interlayer crystallinity conserving pattern 495.

The first upper magnetic structure 491 may be adjacent to the second tunnel barrier pattern 442. The first upper magnetic structure 491 may directly contact an upper surface of the second tunnel barrier pattern 442. For example, the crystal orientation of the first upper magnetic structure 491 may be substantially the same as that of the second tunnel barrier pattern 442. For example, the crystal orientation of the first upper magnetic structure 491 may be substantially parallel with the crystal orientations of the intermediate magnetic pattern 450 and the second tunnel barrier pattern 442.

The first upper magnetic structure 491 may include a magnetic material. The first upper magnetic structure 491 may have a vertical magnetization characteristic. For example, the first upper magnetic structure 491 may include at least one of Co, Fe or Ni, at least one of B, P, As or Bi, and at least one of Pt, Ta, Ru or Pd.

The magnetization direction of the first upper magnetic structure 491 may be fixed. For example, the first upper magnetic structure 491 may serve as a fixed layer.

The upper spacer pattern 492 may be located on the first upper magnetic structure 491. The upper spacer pattern 472 may include a material having a predetermined crystal structure. For example, the upper spacer pattern 472 may include one of Ru, Ir, Re or Os.

The second upper magnetic structure 493 may be located on the upper spacer pattern 492. The second upper magnetic structure 493 may directly contact an upper surface of the upper spacer pattern 492. The crystal orientation of the second upper magnetic structure 493 may be substantially the same as that of the upper spacer pattern 492.

The second upper magnetic structure 493 may include a magnetic material. The second upper magnetic structure 493 may have a vertical magnetization characteristic. For example, the second upper magnetic structure 493 may include at least one of Co, Fe or Ni, at least one of B, P, As or Bi, and at least one of Pt, Ta, Ru or Pd.

The magnetization direction of the second upper magnetic structure 493 may be fixed. For example, the second upper magnetic structure 493 may serve as a fixed layer.

The magnetization direction of the second upper magnetic structure 493 may be different from that of the first upper magnetic structure 491. For example, the upper magnetic structure 490 may have an SAF structure.

The upper interlayer crystallinity conserving pattern 495 may be located between the first upper magnetic structure 491 and the upper spacer pattern 492. The upper interlayer crystallinity conserving pattern 495 may be substantially amorphous. The upper interlayer crystallinity conserving pattern 495 may have a higher crystallization temperature than the second upper magnetic structure 493 and the first upper magnetic structure 491. In some embodiments, the upper interlayer crystallinity conserving pattern 495 may have a crystallization temperature that is substantially the same as that of the upper crystallinity conserving pattern 610.

For example, the upper interlayer crystallinity conserving pattern 495 may include at least one of Fe, Co, Ni, Mn, V, Cr, Zr, Hf, Si, Mg, Al, Ga, Mo, Ti, Ru, Ta, W or Cu, at least one of B, N, P, As, Sb or Bi, and at least one of Zr, Hf, Si, Mo, Ta or Cu. The upper interlayer crystallinity conserving pattern 495 may include the same materials as the upper crystallinity conserving pattern 610. For example, the upper interlayer crystallinity conserving pattern 495 may be CoFeBTa.

The thickness of the upper interlayer crystallinity conserving pattern 495 may be less than that of the first upper magnetic structure 491. The thickness of the upper interlayer crystallinity conserving pattern 495 may be substantially the same as that of the lower interlayer crystallinity conserving pattern 435.

The capping pattern 500 may include a first capping pattern 510 and a second capping pattern 520. The upper electrode 700 may include a first upper electrode 710 and a second upper electrode 720. The upper interconnection 800 may include an upper barrier pattern 810 and an upper conductive pattern 820.

In some embodiments, the lower magnetic structure 430 of the magnetic tunnel junction pattern 400 may include the lower interlayer crystallinity conserving pattern 435. Further, the upper magnetic structure 490 of the magnetic tunnel junction pattern 400 may include the upper interlayer crystallinity conserving pattern 495. Thus, with some embodiments of the inventive concepts, the crystal orientation of the intermediate magnetic pattern 450 may be substantially parallel with the crystal orientations of the second lower magnetic pattern 434, the second tunnel barrier pattern 442, the first tunnel barrier pattern 441, and the first upper magnetic structure 491. Therefore, in the magnetic memory device in accordance with some embodiment of the inventive concepts, an electromagnetic characteristic of the magnetic tunnel junction pattern 400 may be improved.

FIGS. 11 to 33B are cross-sectional views sequentially showing a method of forming a magnetic memory device in accordance with an embodiment of the inventive concepts.

The method of forming the magnetic memory device in accordance with the embodiment of the inventive concepts will be described with reference to FIGS. 2A, 2B, and 11 to 33B. First, referring to FIG. 11, the method of forming the magnetic memory device in accordance with the embodiment of the inventive concepts may include forming a lower plug 300 on a substrate 100.

The lower plug 300 may be fabricated by forming a lower interlayer insulating layer 210 on the substrate 100, forming a lower contact hole 210h in the lower interlayer insulating layer 210, and forming the lower plug 300 in the lower contact hole 210h.

The lower interlayer insulating layer 210 may be formed by depositing an insulating material on the substrate 100. For example, the lower interlayer insulating layer 210 may be formed by depositing silicon oxide or silicon nitride on the substrate 100.

The lower plug 300 may be formed by filling the lower contact hole 210h with a conductive material. For example, the lower plug 300 may be formed by filling the lower contact hole 210h with a metal or a metal nitride.

Figure 12:
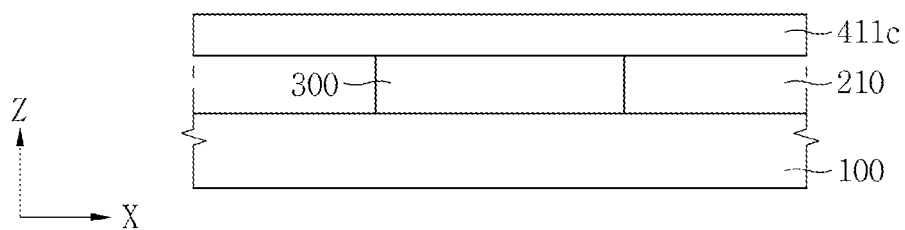

Referring to FIG. 12, the method of forming the magnetic memory device in accordance with the embodiment of the inventive concepts may include forming a seed layer 411c on the lower plug 300.

The seed layer 411c may be formed by depositing a crystalline material, i.e., a material having a predetermined crystal structure on the lower plug 300. For example, the seed layer 411c may be fabricated by forming a crystalline layer including one of Ru, Ti or Ta on the lower plug 300.

Figure 13:
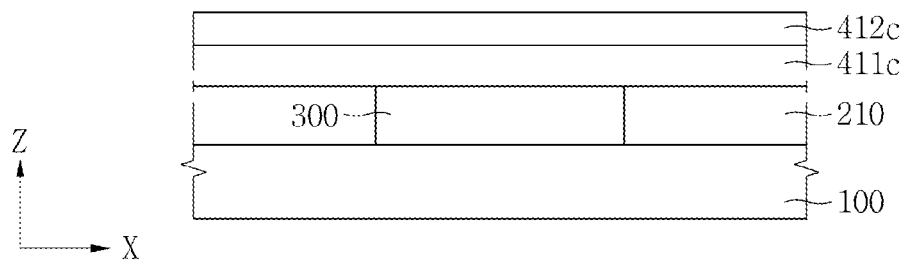

Referring to FIG. 13, a first lower magnetic layer 412c may then be formed on the seed layer 411c.

The first lower magnetic layer 412c may be formed by depositing a crystalline material including a magnetic material on the seed layer 411c. The formation of the first lower magnetic layer 412c may include depositing a material having a vertical magnetization characteristic. For example, the first lower magnetic layer 412c may be fabricated by forming a crystalline layer including at least one of Co, Fe or Ni, and at least one of Pt, Ta, Ru or Pd on the seed layer 411c.

The crystal orientation of the first lower magnetic layer 412c may be affected by the crystal orientation of the seed layer 411c. For example, the crystal orientation of the first lower magnetic layer 412c may be substantially the same as that of the seed layer 411c.

Figure 14:
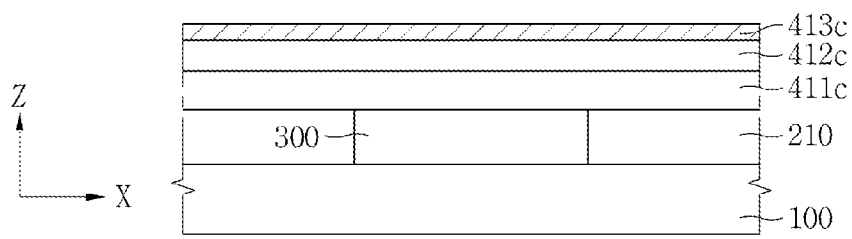

Referring to FIG. 14, the magnetic memory device in accordance with some embodiments of the inventive concepts may be fabricated by forming a spacer layer 413c on the first lower magnetic layer 412c.

The spacer layer 413c may be formed by depositing a crystalline material on the first lower magnetic layer 412c. For example, the spacer layer 413c may be fabricated by forming a crystalline layer including one of Ru, Ir, Re or Os on the first lower magnetic layer 412c.

The spacer layer 413c may be thinner than the first lower magnetic layer 412c.

Figure 15:
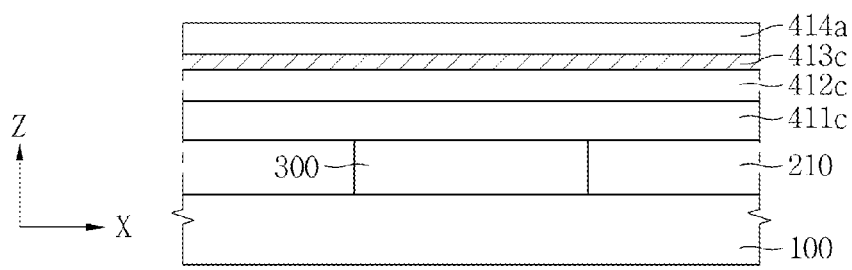

Referring to FIG. 15, the method of forming the magnetic memory device in accordance with some embodiments of the inventive concepts may include forming a preliminary lower magnetic layer 414a on the spacer layer 413c.

The preliminary lower magnetic layer 414a may be formed by depositing a non-crystalline magnetic material layer on the spacer layer 413c. For example, the preliminary lower magnetic layer 414a may be fabricated by forming an amorphous layer including at least one of Co, Fe or Ni, at least one of B, P, As or Bi, and at least one of Pt, Ta, Pd, Tb, Gd or V on the spacer layer 413c.

Figure 16:
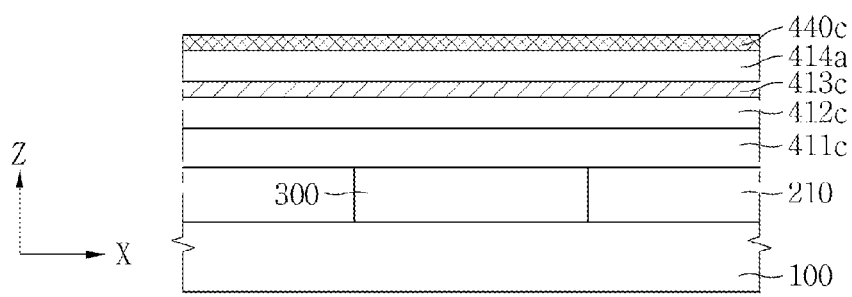

Referring to FIG. 16, the method of forming the magnetic memory device in accordance with some embodiments of the inventive concepts may include forming a tunnel barrier layer 440c on the preliminary lower magnetic layer 414a.

The forming of the tunnel bather layer 440c may include depositing a crystal material which is a non-magnetic material on the preliminary lower magnetic layer 414a. For example, the tunnel barrier layer 440c may be produced by forming a crystalline layer including MgO on the preliminary lower magnetic layer 414a.

The crystal orientation of the tunnel barrier layer 440c may be substantially the same as that of the spacer layer 413c. For example, the crystal orientation of the tunnel barrier layer 440c may be the same as that of the spacer layer 413c.

Figure 17:
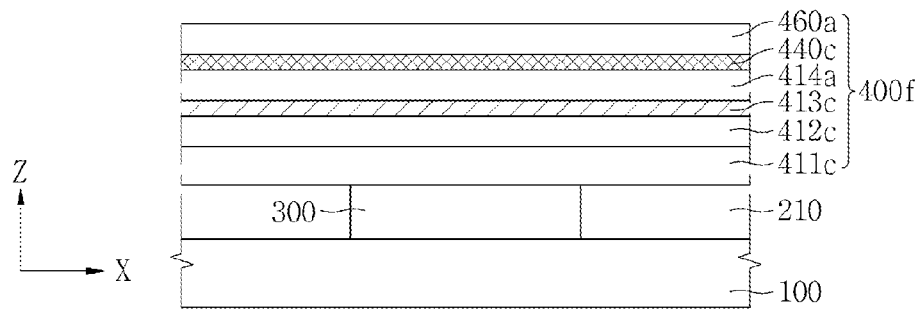

Referring to FIG. 17, in some embodiments, a preliminary upper magnetic layer 460a may be subsequently formed on the tunnel barrier layer 440c.

The preliminary upper magnetic layer 460a may be formed by depositing an amorphous layer with a magnetic material on the tunnel barrier layer 440c. For example, the preliminary upper magnetic layer 460a may be produced by forming the amorphous layer including at least one of Co, Fe or Ni, at least one of B, P, As or Bi, and at least one of Pt, Ta, Pd, Tb, Gd or V on the tunnel barrier layer 440c.

In some embodiments, the seed layer 411c, the first lower magnetic layer 412c, the spacer layer 413c, the preliminary lower magnetic layer 414a, the tunnel barrier layer 440c, and the preliminary upper magnetic layer 460a may be formed to fabricate a magnetic tunnel junction layer 400f.

Figure 18:
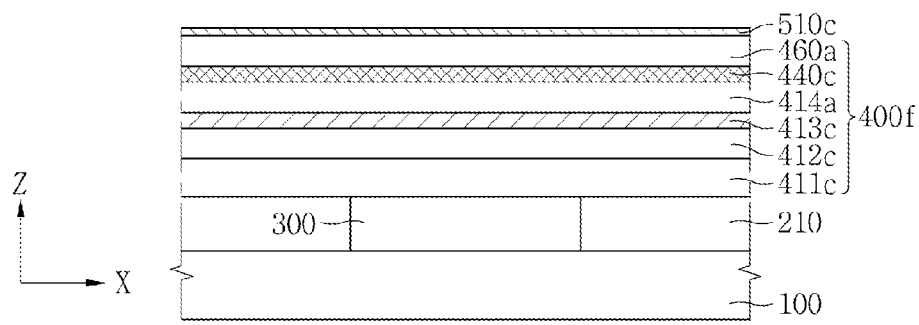

Referring to FIG. 18, a first capping layer 510c may also be formed on the magnetic tunnel junction layer 400f.

For example, the formation of the first capping layer 510c may include forming a crystalline layer including one of Ta, Al, Cu, Au, Ti, TaN or TiN on the magnetic tunnel junction layer 400f. The first capping layer 510c may be thinner than the tunnel barrier layer 440c.

Figure 19:
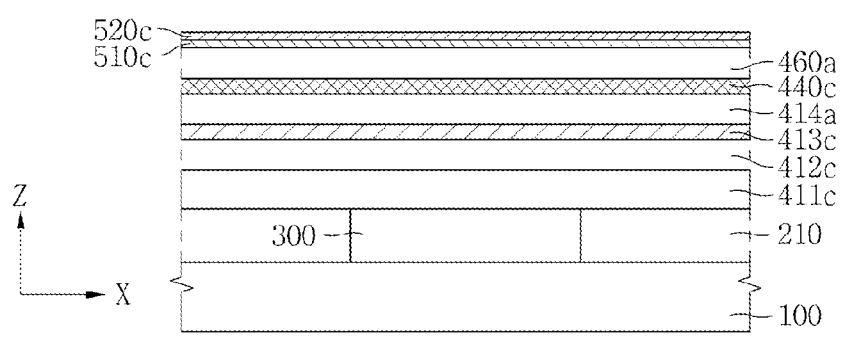

Referring to FIG. 19, a second capping layer 520c may then be formed on the first capping layer 510c.

For example, the second capping layer 520c may be produced by forming a crystalline layer including one of Ta, Al, Cu, Au, Ti, TaN or TiN on the first capping layer 510c.

The second capping layer 520c may be thinner than the tunnel barrier layer 440c. For example, the second capping layer 520c may be formed to have the same thickness as the first capping layer 510c.

The crystal orientation of the second capping layer 520c may be different from that of the first capping layer 510c. For example, the crystal orientation of the second capping layer 520c may be opposite to that of the first capping layer 510c.

Figure 20:
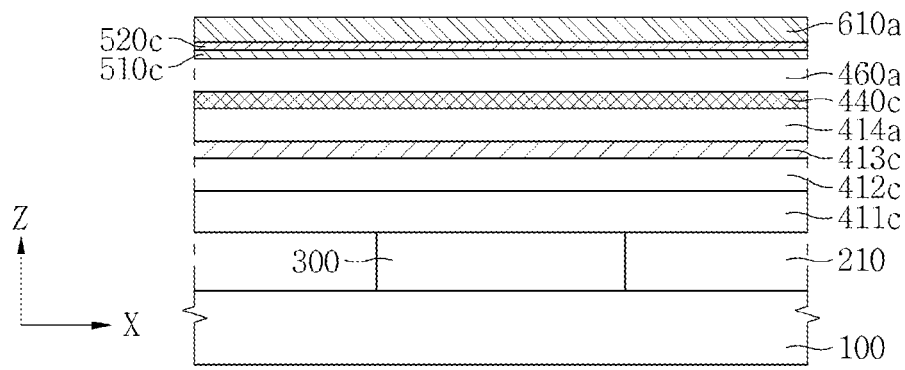

Referring to FIG. 20, the method of forming the magnetic memory device in accordance with some embodiments of the inventive concepts may include forming an upper crystallinity conserving layer 610a on the second capping layer 520c.

The upper crystallinity conserving layer 610a may be formed as an amorphous layer. For example, the upper crystallinity conserving layer 610a may be produced by forming an amorphous layer including at least one of Fe, Co, Ni, Mn, V, Cr, Zr, Hf, Si, Mg, Al, Ga, Mo, Ti, Ru, Ta, W or Cu, at least one of B, N, P, As, Sb or Bi, and at least one of Zr, Hf, Si, Mo, Ta or Cu on the second capping layer 520c.

The upper crystallinity conserving layer 610a may have a higher crystallization temperature than the preliminary lower magnetic layer 414a and the preliminary upper magnetic layer 460a.

Figure 21:
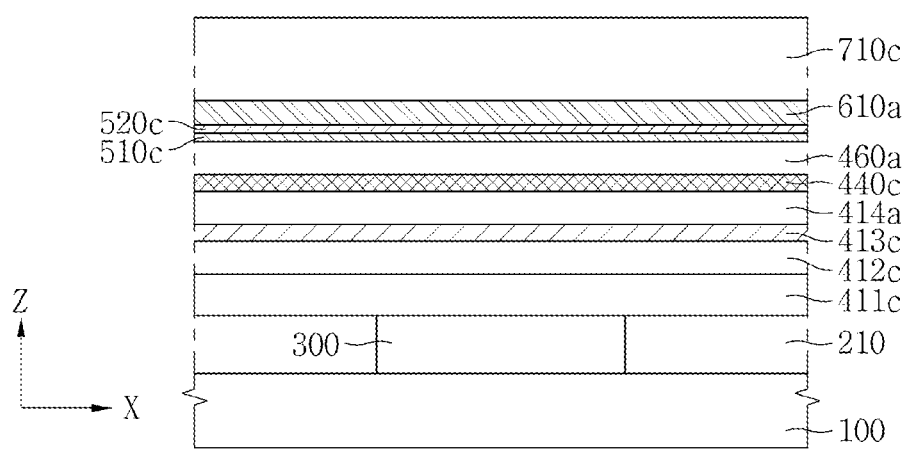

As shown in FIG. 21, a first upper electrode layer 710c is then formed on the upper crystallinity conserving layer 610a.

The first upper electrode layer 710c may be formed by depositing a conductive material on the upper crystallinity conserving layer 610a. For example, the first upper electrode layer 710c may be formed by depositing a metal or a metal nitride on the upper crystallinity conserving layer 610a.

Figure 22:
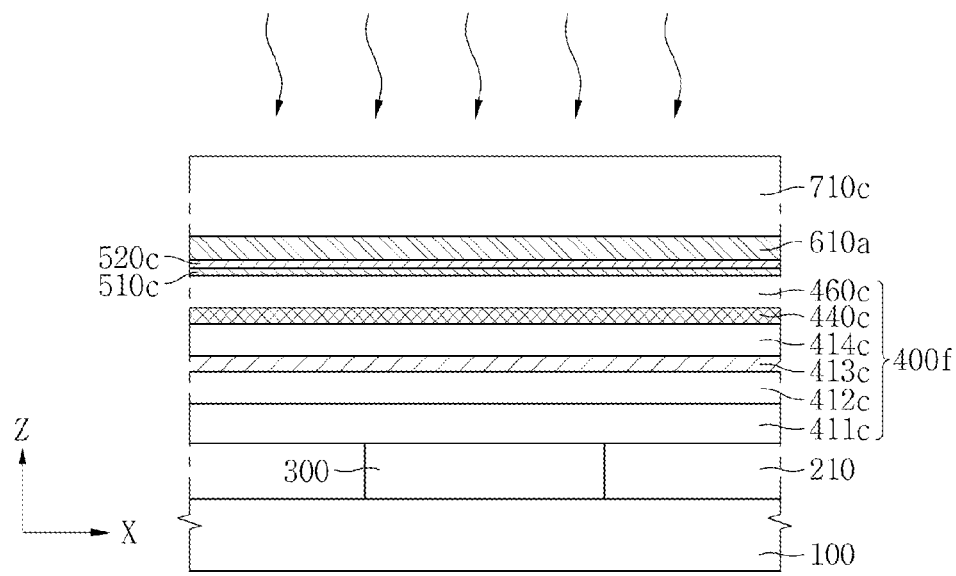

Referring to FIG. 22, a second lower magnetic layer 414c and an upper magnetic layer 460c are subsequently formed on the substrate 100.

The formation of the second lower magnetic layer 414c and the upper magnetic layer 460c may include crystallizing the preliminary lower magnetic layer 414a and the preliminary upper magnetic layer 460a.

The crystallizing of the preliminary lower magnetic layer 414a and the preliminary upper magnetic layer 460a may be performed by an annealing process on the substrate 100 in which the first upper electrode layer 710c is formed.

The annealing process may be performed on the substrate 100 in a state in which a magnetic field is applied to the magnetic tunnel junction layer 400f. For example, the crystallization of the preliminary lower magnetic layer 414a and the preliminary upper magnetic layer 460a may be performed by a magnetic annealing process on the substrate 100.

In some embodiments, the annealing process on the substrate 100 is performed after the first upper electrode layer 710c is formed on the magnetic tunnel junction layer 400f. Thus, the diffusion of impurities into the magnetic tunnel junction layer 400f may be prevented by the first upper electrode layer 710c while the preliminary lower magnetic layer 414a and the preliminary upper magnetic layer 460a are crystallized. Therefore, the distribution of an electromagnetic characteristic of the magnetic tunnel junction layer 400f may be prevented.

The crystallization of the preliminary lower magnetic layer 414a and the preliminary upper magnetic layer 460a may be performed at a lower temperature than the crystallization temperature of the upper crystallinity conserving layer 610a. In some embodiments, the upper crystallinity conserving layer 610a may have a higher crystallization temperature than a process temperature of the annealing process on the substrate 100. Thus, the upper crystallinity conserving layer 610a may be maintained in an amorphous state while the preliminary lower magnetic layer 414a and the preliminary upper magnetic layer 460a are crystallized. That is, the crystal orientation of the first upper electrode layer 710c may not influence the crystallization processes of the preliminary lower magnetic layer 414a and the preliminary upper magnetic layer 460a by the upper crystallinity conserving layer 610a. Therefore, the crystal orientations of the second lower magnetic layer 414c and the upper magnetic layer 460c may be substantially parallel with that of the tunnel barrier layer 440c.

Figure 23:
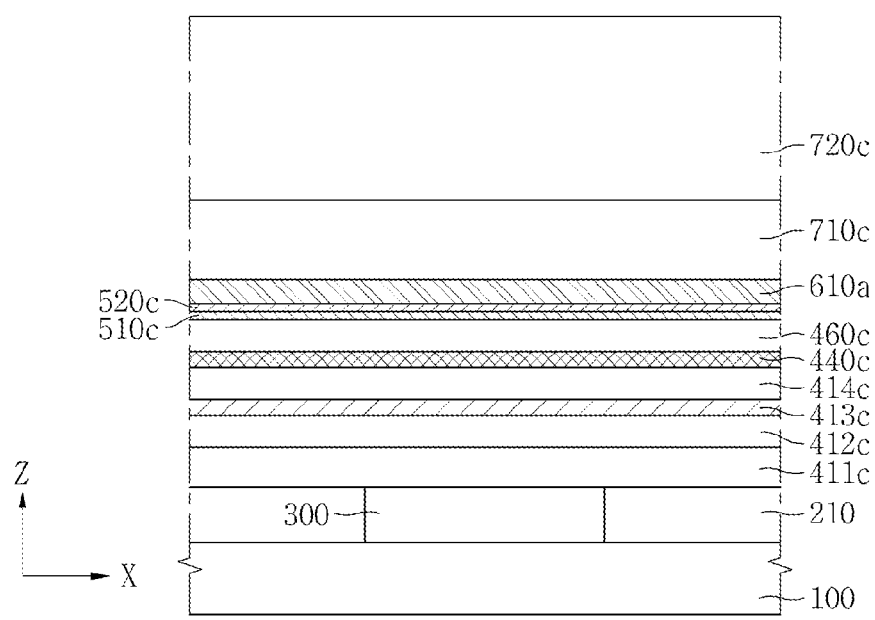

Referring to FIG. 23, a second upper electrode layer 720c may be formed on the first upper electrode layer 710c.

The second upper electrode layer 720c may be formed by depositing a conductive material on the first upper electrode layer 710c. For example, the second upper electrode layer 720c may be formed by depositing a metal or a metal nitride on the first upper electrode layer 710c.

Figure 24:
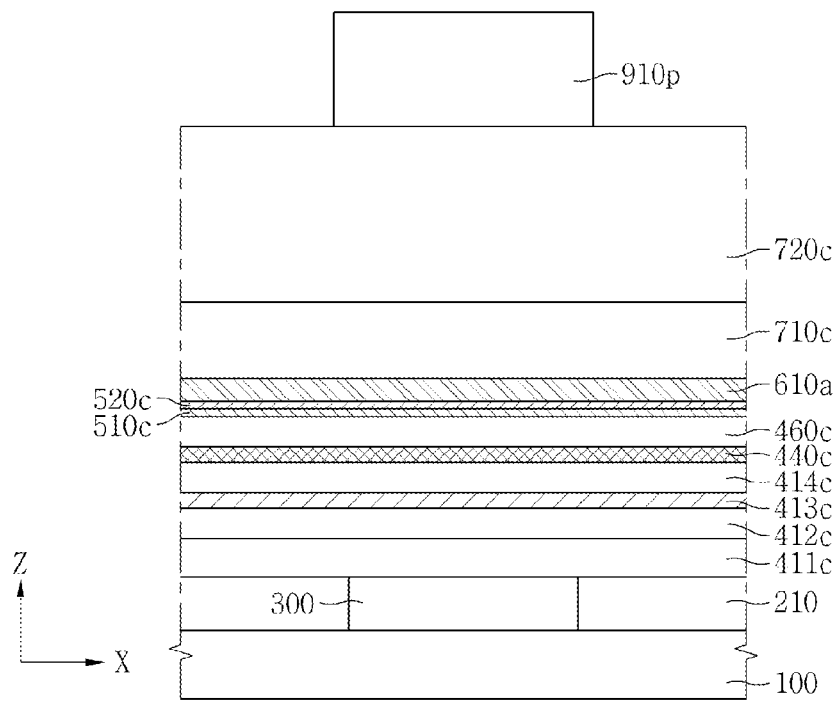

Referring to FIG. 24, a first mask pattern 910p may be formed on the second upper electrode layer 720c.

The first mask pattern 910p may be produced by forming a first mask layer and then patterning the first mask layer. The size of the first mask pattern 910p may be greater than that of the lower plug 300. For example, a length in the X-axis direction of the first mask pattern 910p may be greater than that of the lower plug 300.

Figure 25:
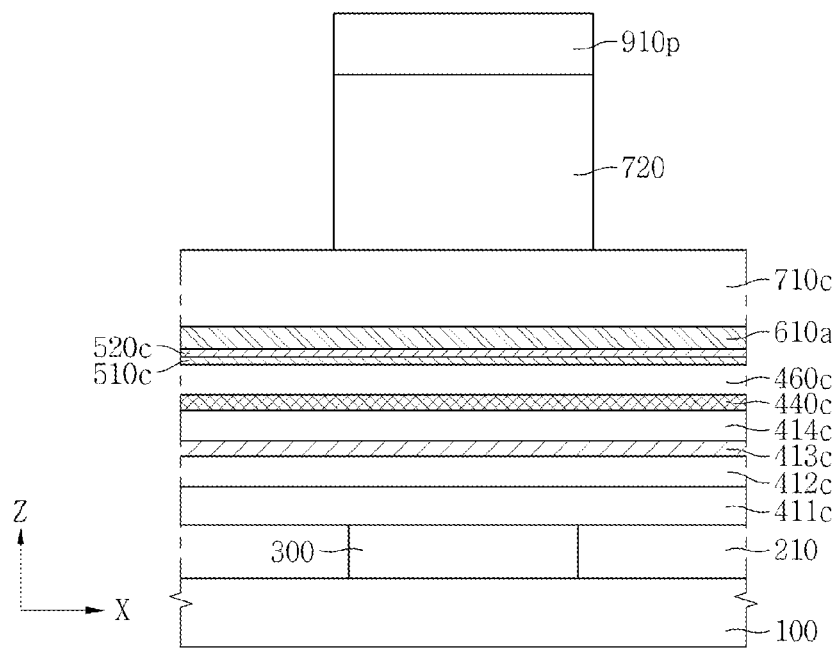

Referring to FIG. 25, a second upper electrode 720 may be formed on the substrate 100.

The forming of the second upper electrode 720 may include etching the second upper electrode layer 720c by a dry etching process using the first mask pattern 910p.

Figure 26:
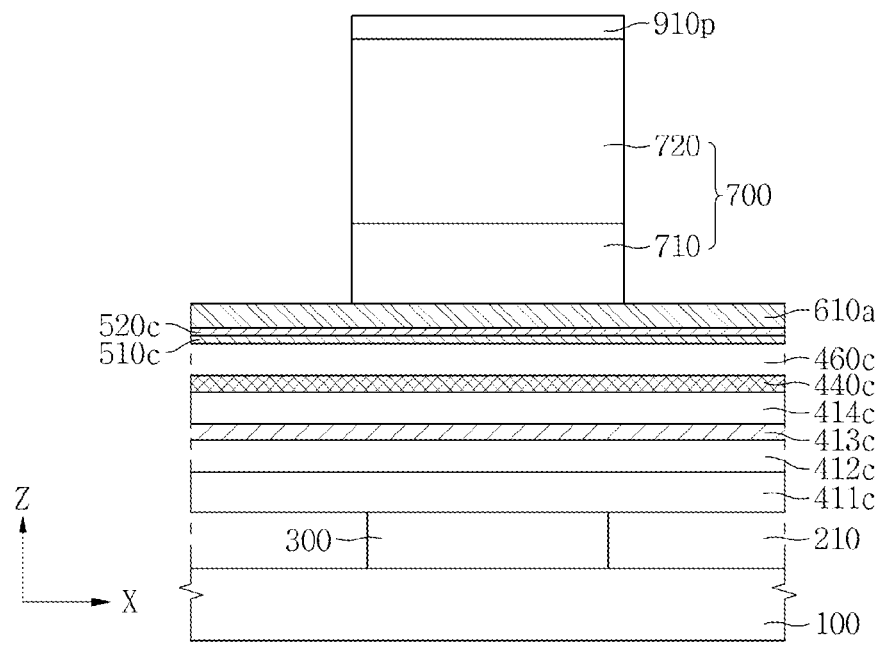

Referring to FIG. 26, a first upper electrode 710 may be formed on the substrate 100.

The forming of the first upper electrode 710 may include etching the first upper electrode layer 710c by a dry etching process using the second upper electrode 720 and the first mask pattern 910p. The side surfaces of the first upper electrode 710 may be vertically aligned with the side surfaces of the second upper electrode 720.

The first upper electrode 710 and the second upper electrode 720 may collectively form an upper electrode 700.

The first upper electrode 710 may be performed after the upper crystallinity conserving layer 610a is formed between the upper magnetic layer 460c and the first upper electrode layer 710c. Therefore, damage to the magnetic tunnel junction layer 400f during the formation of the upper electrode 700 may be prevented by the upper crystallinity conserving layer 610a.

In some embodiments, the etching process of the first upper electrode layer 710c may be performed in a different method from the etching of the second upper electrode layer 720c. For example, an etching gas used in the etching of the first upper electrode layer 710c may have a lower rate of $Cl_2$ than an etching gas used in the etching of the second upper electrode layer 720c. For example, the etching process of the first upper electrode layer 710c may be performed at a lower voltage than the etching process of the second upper electrode layer 720c. Thus, an impact applied to lower components due to the formation of the upper electrode 700 may be reduced. Therefore, the deformation of the magnetic tunnel junction layer 400f may be prevented from the forming of the upper electrode 700.

Figure 27:
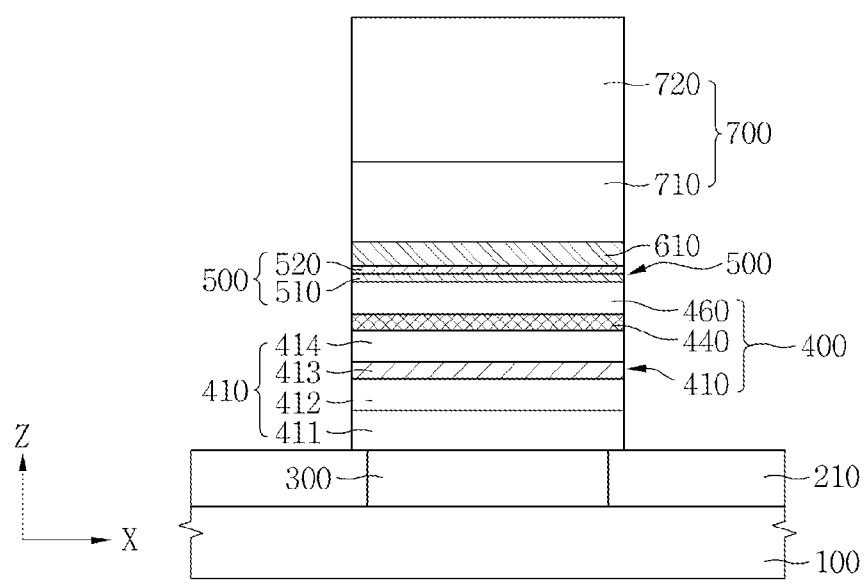

Referring to FIG. 27, a magnetic tunnel junction pattern 400, a capping pattern 500, and an upper crystallinity conserving pattern 610 may be formed on the substrate 100.

The forming of the magnetic tunnel junction pattern 400, the capping pattern 500, and the upper crystallinity conserving pattern 610 may include forming the upper crystallinity conserving pattern 610 under the upper electrode 700, forming the capping pattern 500 under the upper crystallinity conserving pattern 610, and forming the magnetic tunnel junction pattern 400 under the capping pattern 500.

The forming of the upper crystallinity conserving pattern 610 may include etching the upper crystallinity conserving layer 610a by a dry etching process using the upper electrode 700 and the first mask pattern 910p. The side surfaces of the upper crystallinity conserving pattern 610 may be vertically aligned with the side surfaces of the upper electrode 700.

The forming of the capping pattern 500 may include forming a second capping pattern 520 and forming a first capping pattern 510 under the second capping pattern 520. For example, the forming of the capping pattern 500 may include sequentially etching the second capping layer 520c and the first capping layer 510c by a dry etching process using the upper crystallinity conserving layer 610a, the upper electrode 700, and the first mask pattern 910p. The side surfaces of the capping pattern 500 may be vertically aligned with the side surfaces of the upper crystallinity conserving pattern 610.

The forming of the magnetic tunnel junction pattern 400 may include forming an upper magnetic pattern 460, forming a tunnel bather pattern 440 under the upper magnetic pattern 460, and forming a lower magnetic structure 410 under the tunnel bather pattern 440. The forming of the lower magnetic structure 410 may include forming a second lower magnetic pattern 414, forming a spacer pattern 413 under the second lower magnetic pattern 414, forming a first lower magnetic pattern 412 under the spacer pattern 413, and forming a seed pattern 411 under the first lower magnetic pattern 412. For example, the forming of the magnetic tunnel junction pattern 400 may include sequentially etching the upper magnetic layer 460c, the tunnel barrier layer 440c, the second lower magnetic layer 414c, the spacer layer 413c, the first lower magnetic layer 412c, and the seed layer 411c by a dry etching process using the capping pattern 500, the upper crystallinity conserving pattern 610, the upper electrode 700, and the first mask pattern 910p. Sides of the magnetic tunnel junction pattern 400 may be vertically aligned with the sides of the capping pattern 500.

In some embodiments, the first mask pattern 910p may be removed by a process of the forming of the magnetic tunnel junction pattern 400, the capping pattern 500, the upper crystallinity conserving pattern 610, and the upper electrode 700.

Figure 28:
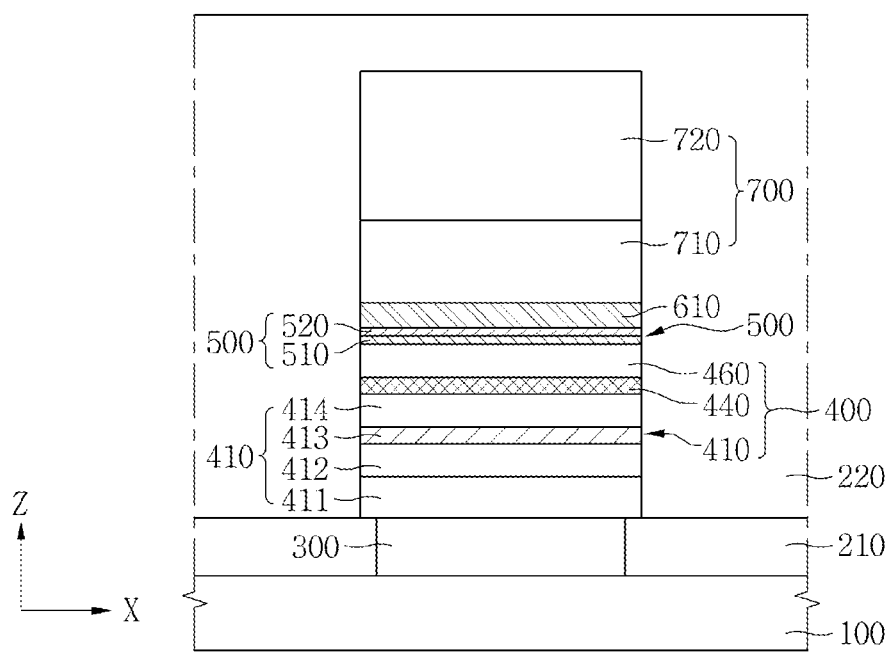

Referring to FIG. 28, the upper interlayer insulating layer 220 may be formed on the substrate 100.

In particular, the level of an upper surface of the upper interlayer insulating layer 220 may be higher than that of an upper surface of the upper electrode 700. The side surfaces of the magnetic tunnel junction pattern 400, the side surfaces of the capping pattern 500, the side surfaces of the upper crystallinity conserving pattern 610, and the side surfaces of the upper electrode 700 may be surrounded by the upper interlayer insulating layer 220. The upper surface of the upper electrode 700 may be surrounded by the upper interlayer insulating layer 220.

The upper interlayer insulating layer 220 may be formed by depositing an insulating material on the substrate 100. For example, the upper interlayer insulating layer 220 may be formed by depositing a suitable dielectric material such as silicon oxide or silicon nitride on the substrate 100. The upper interlayer insulating layer 220 may be formed of substantially the same material as the lower interlayer insulating layer 210.

Figure 29A:
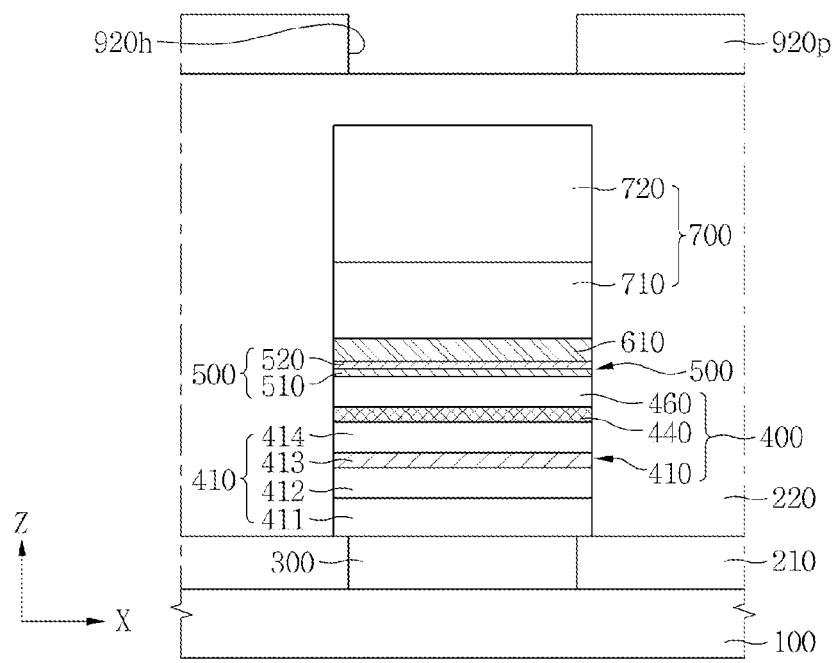
Figure 29B:
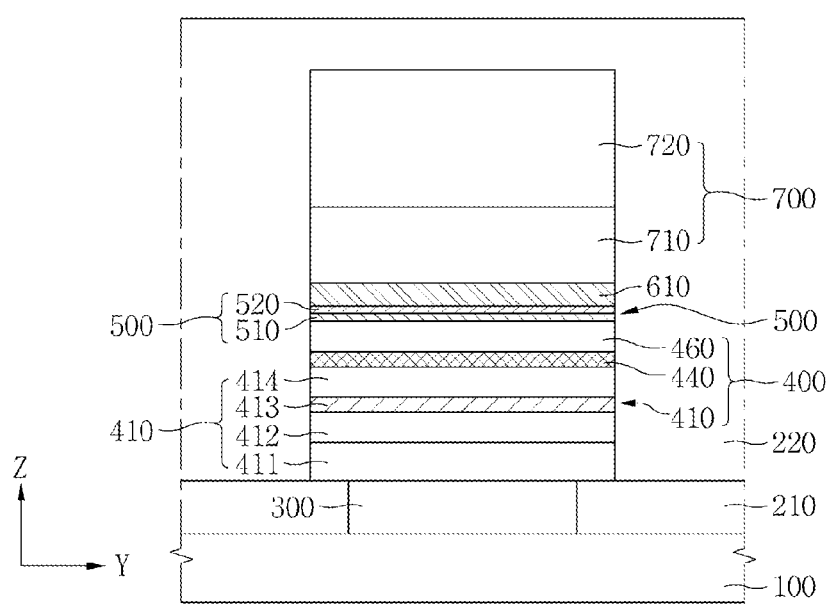

Referring to FIGS. 29A and 29B, a second mask pattern 920p may be formed on the upper interlayer insulating layer 220.

The forming of the second mask pattern 920p may include forming a second mask layer on the upper interlayer insulating layer 220 and forming a mask hole 920h in the second mask layer.

A length in the X-axis direction of the mask hole 920h may be less than that of the upper electrode 700. The mask hole 920h may extend in the Y-axis direction.

Figure 30A:
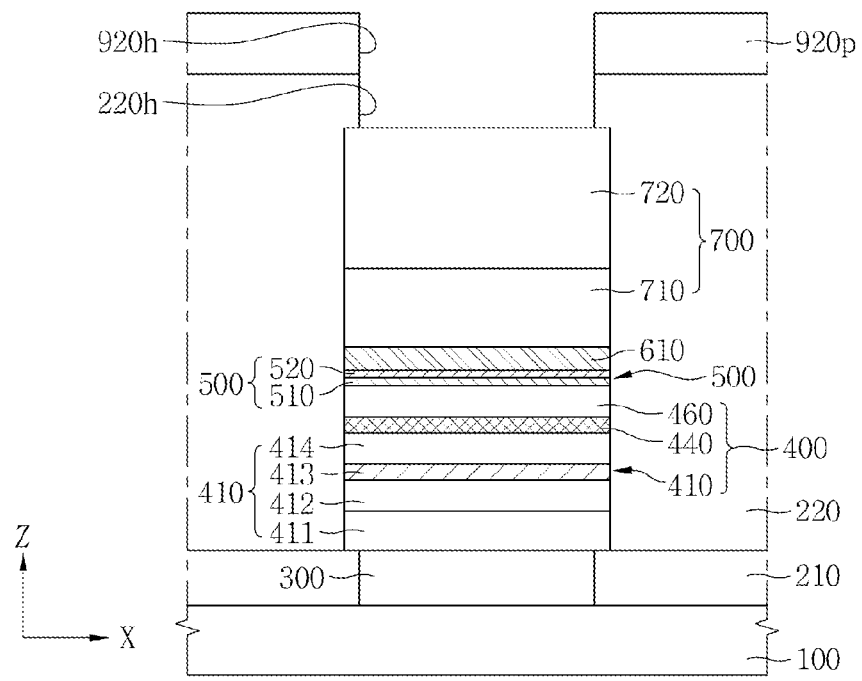
Figure 30B:
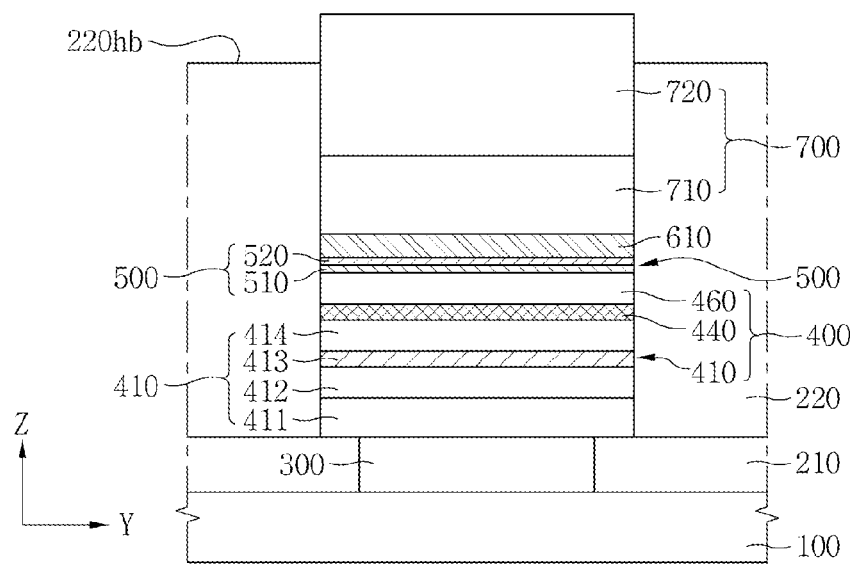

Referring to FIGS. 30A and 30B, the method of forming the magnetic memory device in accordance with some embodiment of the inventive concepts may include forming an upper contact hole 220h in the upper interlayer insulating layer 220.

The forming of the upper contact hole 220h may include etching the upper interlayer insulating layer 220 by a dry etching process using the second mask pattern 920p. For example, a length in the X-axis direction of the upper contact hole 220h may be less than that of the upper electrode 700. The upper contact hole 220h may extend in the Y-axis direction.

In some embodiments, an upper surface of the upper electrode 700 may be exposed by the forming of the upper contact hole 220h. The lowest level of a bottom 220hb of the upper contact hole 220h may be lower than the level of the upper surface of the upper electrode 700.

Figure 31A:
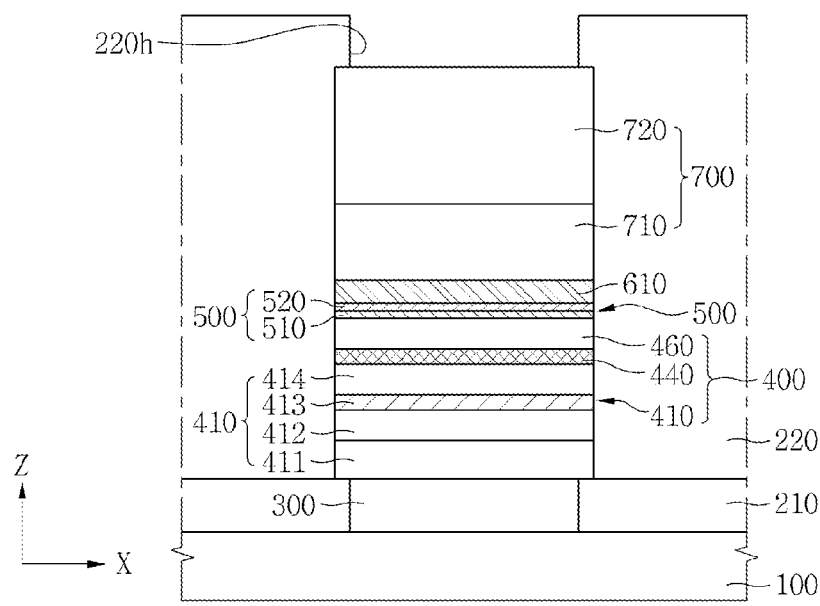
Figure 31B:
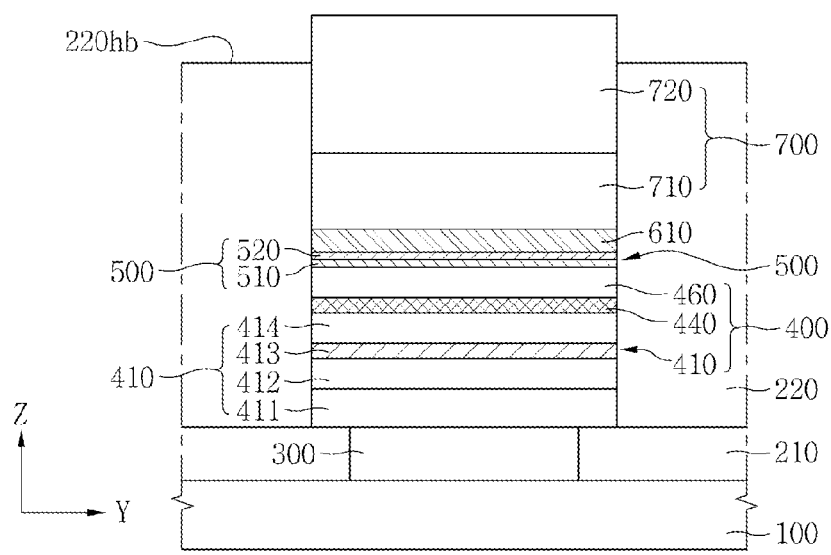

Referring to FIGS. 31A and 31B, then the second mask pattern 920p is removed.

Figure 32A:
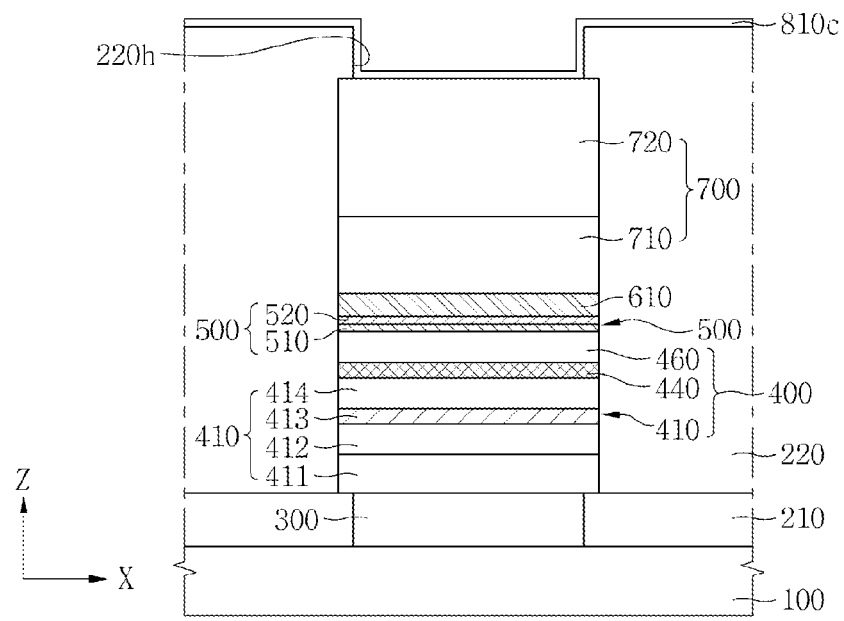
Figure 32B:
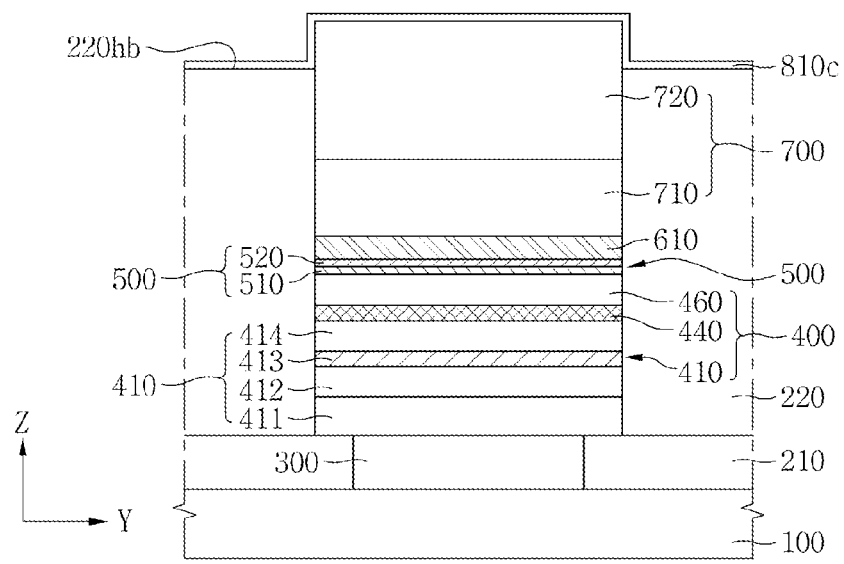

Subsequently, an upper bather layer 810c may be formed on the upper interlayer insulating layer 220 and the upper electrode 700 as shown FIGS. 32A and 32B.

In some embodiments, the upper bather layer 810c may be formed by depositing a metal nitride on the upper interlayer insulating layer 220 in which the upper contact hole 220h is formed.

Figure 33A:
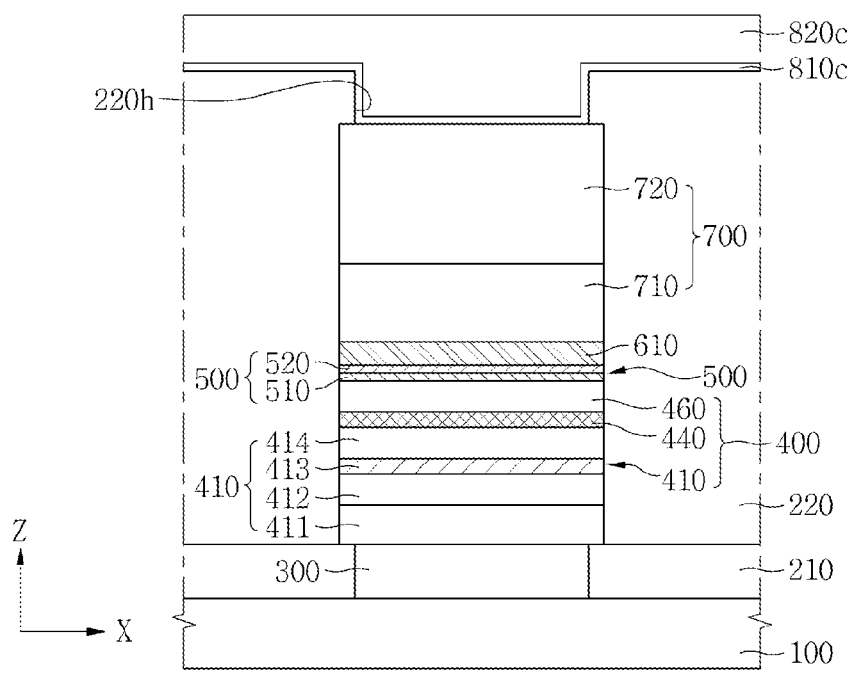
Figure 33B:
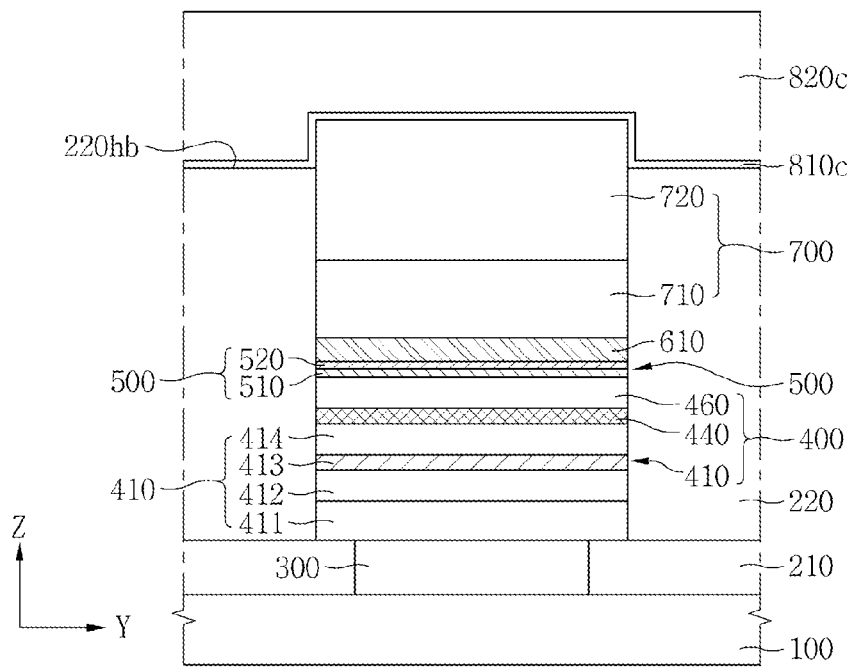

Referring to FIGS. 33A and 33B, an upper conductive layer 820c may then be formed on the upper bather layer 810c.

The upper conductive layer 820c may be formed by depositing a conductive material on the upper barrier layer 810c. The forming of the upper conductive layer 820c may include filling the upper contact hole 220h with a conductive material. For example, the forming of the upper conductive layer 820c may include depositing a metal on the upper barrier layer 810c.

Referring to FIGS. 2A and 2B, an upper interconnection 800 may thus be formed in the upper contact hole 220h as explained below.

The upper interconnection 800 may be produced by forming an upper bather pattern 810 and forming an upper conductive pattern 820. The upper conductive pattern 820 may be simultaneously formed with the upper bather pattern 810. For example, the upper interconnection 800 may be formed by planarizing the upper barrier layer 810c and the upper conductive layer 820c so that an upper surface of the upper interlayer insulating layer 220 is exposed.

In some embodiments, the upper interconnection 800 may be formed on the upper electrode 700 by a damascene process. In some embodiments, the upper electrode 700 may be formed to have a sufficient thickness by the upper crystallinity conserving layer 610a. Thus, with some embodiments of the inventive concepts, the upper interconnection 800 may be formed without regard to damage to the magnetic tunnel junction pattern 400.

FIGS. 34 to 38 are cross-sectional views sequentially showing a method of forming a magnetic memory device in accordance with some embodiments of the inventive concepts.

The method of forming the magnetic memory device in accordance with some embodiments of the inventive concepts will be described with reference to FIGS. 9 and 34 to 38.

Figure 34:
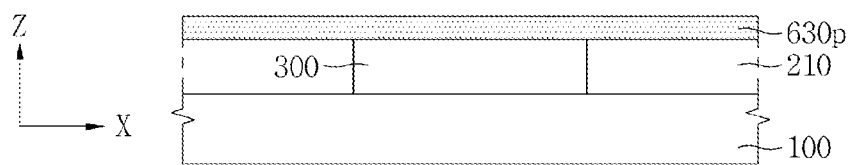
FIGS. 34 to 38 are cross-sectional views sequentially showing a method of forming a magnetic memory device in accordance with another embodiment of the inventive concepts.

First, a preliminary lower crystallinity conserving layer 630p may be formed on a substrate 100 including a lower interlayer insulating layer 210 and a lower plug 300 as shown in FIG. 34.

The preliminary lower crystallinity conserving layer 630p may not include one of materials included in a lower crystallinity conserving layer to be formed by a subsequent process. For example, the preliminary lower crystallinity conserving layer 630p may be produced by forming a layer including at least one of Fe, Co, Ni, Mn, V, Cr, Zr, Hf, Si, Mg, Al, Ga, Mo, Ti, Ru, Ta, W or Cu and at least one of Zr, Hf, Si, Mo, Ta or Cu on the lower interlayer insulating layer 210 and the lower plug 300.

Figure 35:
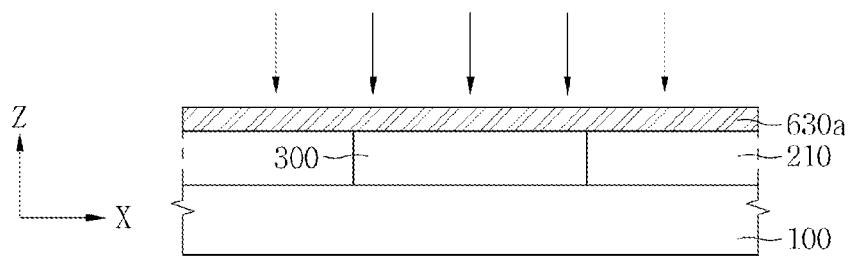
Figure 36:
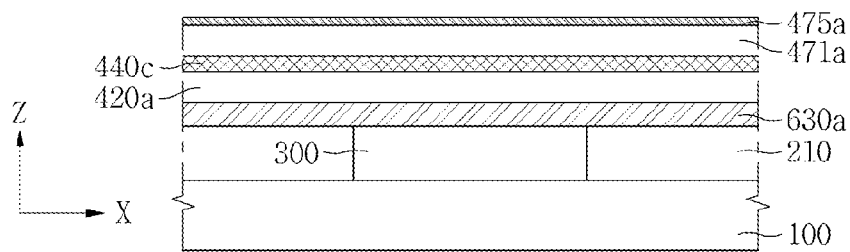

Referring to FIG. 35, a lower crystallinity conserving layer 630a may be formed on the lower interlayer insulating layer 210 and the lower plug 300. In particular, the lower crystallinity conserving layer 630a may be formed by performing ion implantation of materials, which are not included in the preliminary lower crystallinity conserving layer 630p, into the preliminary lower crystallinity conserving layer 630p such that the lower crystallinity conserving layer 630a include such materials. For example, the lower crystallinity conserving layer 630a may be formed by implanting ions of at least one of B, N, P, As, Sb or Bi into the preliminary lower crystallinity conserving layer 630p.

In some embodiments, the lower crystallinity conserving layer 630a may be produced by forming the preliminary lower crystallinity conserving layer 630p which does not include a first material of the materials included in the lower crystallinity conserving layer 630a, and implanting ions of the first material into the preliminary lower crystallinity conserving layer 630p. Thus, the lower crystallinity conserving layer 630a may be formed as a substantially uniform amorphous layer.

Then, a preliminary lower magnetic layer 420a may be formed on the lower crystallinity conserving layer 630a. A tunnel barrier layer 440c may be on the preliminary lower magnetic layer 420a. Next, a preliminary upper magnetic layer 471a may be formed on the tunnel barrier layer 440c. Subsequently, an upper interlayer crystal protection layer 475a may be formed on the preliminary upper magnetic layer 471a.

The forming of the preliminary lower magnetic layer 420a may include depositing a non-crystalline magnetic material layer on the lower crystallinity conserving layer 630a. The forming of the tunnel barrier layer 440c may include depositing a crystalline non-magnetic material layer on the preliminary lower magnetic layer 420a. The forming of the preliminary upper magnetic layer 471a may include depositing a non-crystalline magnetic material layer on the tunnel barrier layer 440c.

The upper interlayer crystal protection layer 475a may be formed as an amorphous layer. The upper interlayer crystal protection layer 475a may have a higher crystallization temperature than the preliminary lower magnetic layer 420a and the preliminary upper magnetic layer 471a. The upper interlayer crystal protection layer 475a may have a crystallization temperature that is substantially the same as that of the lower crystallinity conserving layer 630a. For example, the forming of the upper interlayer crystal protection layer 475a may include forming an amorphous layer including at least one of Fe, Co, Ni, Mn, V, Cr, Zr, Hf, Si, Mg, Al, Ga, Mo, Ti, Ru, Ta, W or Cu, at least one of B, N, P, As, Sb or Bi, and at least one of Zr, Hf, Si, Mo, Ta or Cu.

Figure 37:
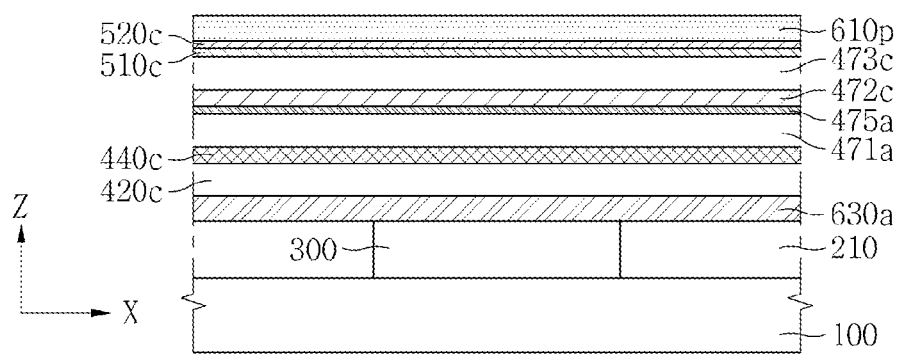

Referring to FIG. 37, an upper spacer layer 472c may be formed on the upper interlayer crystal protection layer 475a. A second upper magnetic layer 473c may be formed on the upper spacer layer 472c. A first capping layer 510c may be formed on the second upper magnetic layer 473c and a second capping layer 520c may be formed on the first capping layer 510c. Then, a preliminary upper crystallinity conserving layer 610p may be formed on the second capping layer 520c.

The upper spacer layer 472c may be formed by depositing a crystalline material having a predetermined crystal structure on the upper interlayer crystal protection layer 475a. The second upper magnetic layer 473c may be formed by depositing a crystalline magnetic material on the upper spacer layer 472c.

The preliminary upper crystallinity conserving layer 610p may not include one of materials included in an upper crystallinity conserving layer to be formed by a subsequent process. For example, the forming of the preliminary upper crystallinity conserving layer 610p may include forming a layer including at least one of Fe, Co, Ni, Mn, V, Cr, Zr, Hf, Si, Mg, Al, Ga, Mo, Ti, Ru, Ta, W or Cu and at least one of Zr, Hf, Si, Mo, Ta or Cu on the second capping layer 520c. The preliminary upper crystallinity conserving layer 610p may include the same material as the preliminary lower crystallinity conserving layer 630p.

Figure 38:
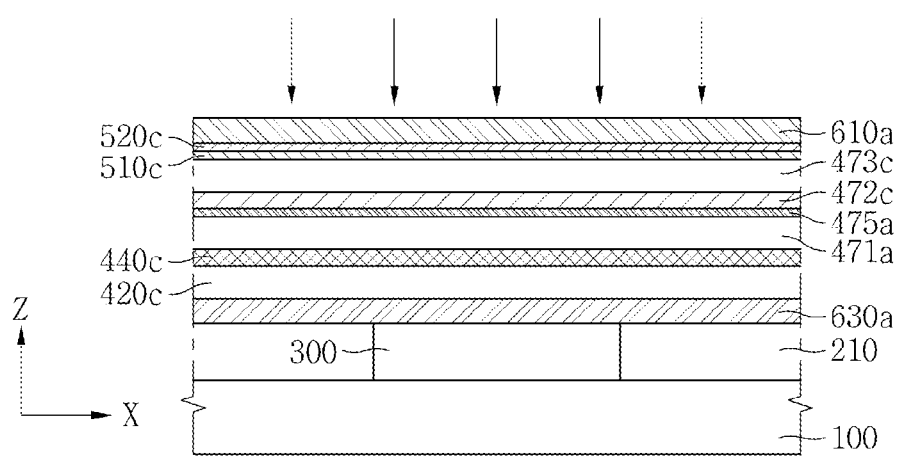

Referring to FIG. 38, an upper crystallinity conserving layer 610a may then be formed on the second capping layer 520c.

The upper crystallinity conserving layer 610a may be formed by performing ion implantation of materials, (which are not included in the preliminary upper crystallinity conserving layer 610p, but which are included in the upper crystallinity conserving layer 610a) into the preliminary upper crystallinity conserving layer 610p. For example, the upper crystallinity conserving layer 610a may be formed by implanting ions one of B, N, P, As, Sb or Bi into the preliminary upper crystallinity conserving layer 610p.

The upper crystallinity conserving layer 610a may have a crystallization temperature that is substantially the same as that of the lower crystallinity conserving layer 630a. For example, the upper crystallinity conserving layer 610a may include all materials contained in the lower crystallinity conserving layer 630a. The component ratio of the materials in the upper crystallinity conserving layer 610a may be substantially the same as that of the lower crystallinity conserving layer 630a.

Referring to FIG. 9, the method of forming the magnetic memory device in accordance with some embodiment of the inventive concepts may include forming the first upper electrode layer on the upper crystallinity conserving layer 610a, crystallizing the preliminary lower magnetic layer 420a and the preliminary upper magnetic layer 471a at a temperature in which the lower crystallinity conserving layer 630a and the upper crystallinity conserving layer 610a are not crystallized, forming the upper electrode 700 on the upper crystallinity conserving layer 610a, forming the upper crystallinity conserving pattern 610, forming the capping pattern 500, forming the magnetic tunnel junction pattern 400, forming the lower crystal protection pattern 630, forming the upper interlayer insulating layer 220, and forming the upper interconnection 800.

Figure 39:
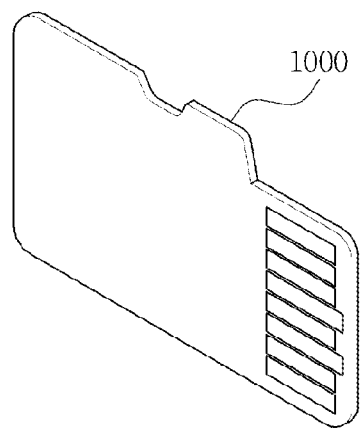
FIG. 39 is a schematic view showing a memory module including the magnetic memory device in accordance with the embodiments of the inventive concepts.

FIG. 39 is a schematic view showing a memory module including the magnetic memory device in accordance with the embodiments of the inventive concepts.

Referring to FIG. 39, a memory module 1000 may be a memory card. For example, the memory module 1000 may be a micro SD card. The memory module 1000 may include the magnetic memory device in accordance with the embodiments of the inventive concepts. Thus, in the memory module 1000 in accordance with embodiments of the inventive concepts, reliability may be improved.

Figure 40:
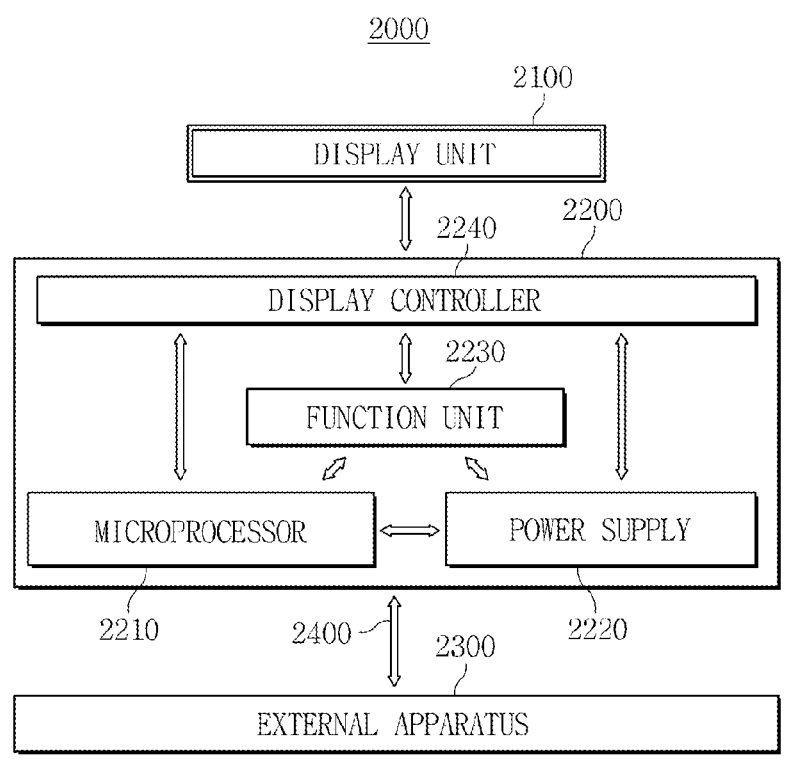
FIG. 40 is a schematic view showing a mobile system including the magnetic memory device in accordance with the embodiments of the inventive concepts.

FIG. 40 is a schematic view showing a mobile system including the magnetic memory device in accordance with the embodiments of the inventive concepts.

Referring to FIG. 40, a mobile system 2000 may include a display unit 2100, a body unit 2200, and an external apparatus 2300. The body unit 2200 may include a microprocessor 2210, a power supply 2220, a function unit 2230, and a display controller 2240.

The display unit 2100 may be electrically connected to the body unit 2200. The display unit 2100 may be electrically connected to the display controller 2240 of the body unit 2200. The display unit 2100 may display an image processed by the display controller 2240 of the body unit 2200.

The body unit 2200 may include a system board or a motherboard having a printed circuit board (PCB). The microprocessor 2210, the power supply 2220, the function unit 2230, and the display controller 2240 may be mounted or disposed on the body unit 2200.

The microprocessor 2210 may receive a voltage from the power supply 2220 to control the function unit 2230 and the display controller 2240. The power supply 2220 may receive a constant voltage from an external power supply, divide the voltage into various voltage levels, and supply the voltages to the microprocessor 2210, the function unit 2230, the display controller 2240, etc.

The power supply 2220 may include a power management IC (PMIC). The PMIC may efficiently supply a voltage to the microprocessor 2210, the function unit 2230, the display controller 2240, etc.

The function unit 2230 may perform various functions of the mobile system 2000. For example, the function unit 2230 may include various components to perform wireless communication functions such as video output to the display unit 2100 or voice output to a speaker through dialing or communication with the external apparatus 2300. For example, the function unit 2230 may serve as an image processor of a camera.

The function unit 2230, when the mobile system 2000 is connected to a memory card to expand the capacity, may serve as a memory card controller. The function unit 2230, when the mobile system 2000 further includes a Universal Serial Bus (USB) to expand the functions, may serve as an interface controller.

The microprocessor 2210, the power supply 2220, and the function unit 2230 may include the magnetic memory device in accordance with the embodiments of the inventive concepts. Therefore, in the mobile system 2000 in accordance with the embodiments of the inventive concepts, reliability may be improved.

Figure 41:
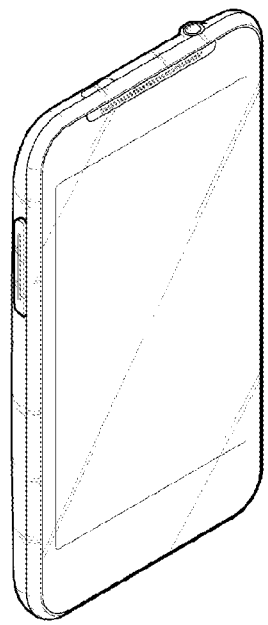
FIG. 41 is a schematic view showing a mobile device including the magnetic memory device in accordance with the embodiments of the inventive concepts.

FIG. 41 is a schematic view showing a mobile device including the magnetic memory device in accordance with the embodiments of the inventive concepts.

Referring FIG. 41, for example, a mobile device 3000 may be a mobile wireless phone. For example, the mobile device 3000 may be a tablet PC. The mobile device 3000 may include the magnetic memory device in accordance with the embodiments of the inventive concepts. Therefore, in the mobile device 3000 in accordance with the embodiments of the inventive concepts, reliability may be improved.

Figure 42:
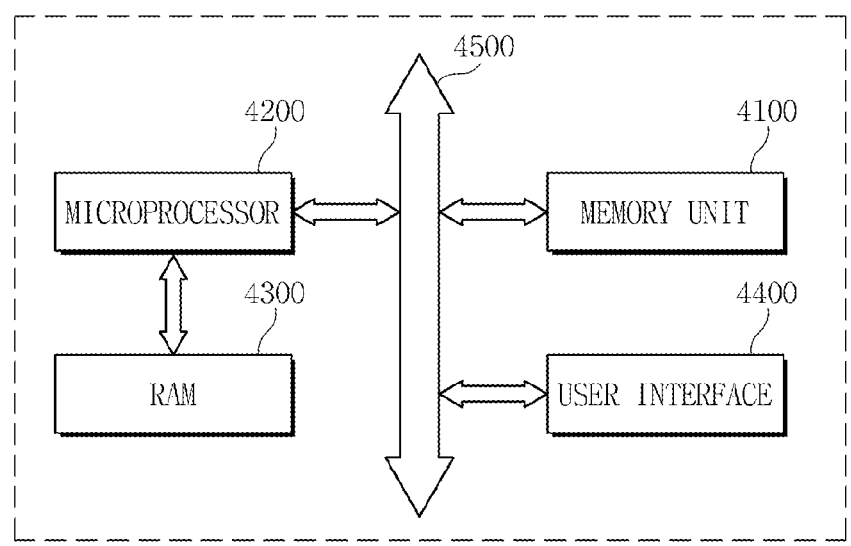
FIG. 42 is a schematic view showing an electronic system including the magnetic memory device in accordance with the embodiments of the inventive concepts.

FIG. 42 is a schematic view showing an electronic system including the magnetic memory device in accordance with the embodiments of the inventive concepts.

Referring to FIG. 42, an electronic system 4000 may include a memory unit 4100, a microprocessor 4200, a random access memory (RAM) 4300, and a user interface 4400. The electronic system 4000 may be a system of a LED lighting device, a refrigerator, an air conditioner, an industrial cutter, a welding, an automobile, an aircraft, a satellite, etc.

The memory unit 4100 may store codes for booting of the microprocessor 4200, data processed by the microprocessor 4200, or data received from the outside. The memory unit 4100 may include a controller and a memory.

The microprocessor 4200 may program and control the electronic system 4000. The RAM 4300 may be used as an operational memory of the microprocessor 4200.

The user interface 4400 may perform data communication using a bus 4500. The user interface 4400 may be used to input or output data to or from the electronic system 4000.

The memory unit 4100, the microprocessor 4200, and the RAM 4300 may include the magnetic memory device in accordance with the embodiments of the inventive concepts.

Therefore, in the electronic system 4000 in accordance with the embodiments of the inventive concepts, reliability may be improved.

According to the magnetic memory device and the method of forming the same in accordance with some embodiments of the inventive concepts, effects of adjacent components on determination of crystal orientations of the magnetic patterns of the magnetic tunnel junction pattern can be blocked using an amorphous crystallinity conserving pattern. Further, according to the magnetic memory device and the method of forming the same in accordance with the embodiments of the inventive concepts, damage of the magnetic patterns can be prevented from the forming process using an amorphous upper crystallinity conserving pattern. Thus, in the magnetic memory device and the method of forming the same in accordance with the embodiments of the inventive concepts, an electromagnetic characteristic of the magnetic tunnel junction layer can be improved. Therefore, in the magnetic memory device and the method of forming the same in accordance with the embodiments of the inventive concepts, reliability can be improved.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A magnetic memory device, comprising:
    a magnetic tunnel junction pattern disposed on a substrate and including a fixed magnetic pattern, a free magnetic pattern and a tunnel barrier pattern located between the fixed magnetic
    pattern and the free magnetic pattern;
    an upper electrode disposed on the magnetic tunnel junction pattern; and
    a crystallinity conserving pattern disposed between the magnetic tunnel junction pattern and the upper electrode,
    wherein at least a portion of the crystallinity conserving pattern comprises an amorphous layer.

2. The device according to claim 1, wherein the crystallinity conserving pattern includes at least one of Fe, Co, Ni, and Ta.

3. The device according to claim 1, further comprising a first capping layer on the crystallinity conserving pattern.

4. The device according to claim 2, wherein the crystallinity conserving pattern further comprising at least one of B, N, and P.

5. The device according to claim 4, wherein the crystallinity conserving pattern comprises CoFeBTa.

6. The device according to claim 3, wherein the first capping layer includes Ru.

7. The device according to claim 6, wherein the crystallinity conserving pattern directly contacts the first capping layer.

8. The device according to claim 7, further comprising a second capping layer disposed between the crystallinity conserving pattern and the free layer.

9. The device according to claim 8, wherein the second capping layer includes Ru.

10. A magnetic memory device, comprising:
   a magnetic tunnel junction pattern disposed on a substrate, the magnetic tunnel junction pattern including a first fixed magnetic pattern, a first tunnel barrier pattern, a free magnetic pattern, a second tunnel barrier pattern, and a second fixed magnetic pattern, which are sequentially stacked; and
   a crystallinity conserving pattern located on the magnetic tunnel junction pattern and at least a portion of the crystallinity conserving pattern comprises an amorphous layer.

11. The device according to claim 10, wherein the crystallinity conserving pattern includes at least one of Fe, Co, Ni, and Ta.

12. The device according to claim 11, wherein the crystallinity conserving pattern further comprises at least one of B, N, and P.

13. The device according to claim 12, wherein the crystallinity conserving pattern comprises CoFeBTa.

* * * * *